(12) United States Patent
Shi et al.

(10) Patent No.: US 8,835,204 B2
(45) Date of Patent: Sep. 16, 2014

(54) METHOD FOR MANUFACTURING MULTI-DIMENSIONAL TARGET WAVEGUIDE GRATING AND VOLUME GRATING WITH MICRO-STRUCTURE QUASI-PHASE-MATCHING

(75) Inventors: Yuechun Shi, Nanjing (CN); Xiangfei Chen, Nanjing (CN)

(73) Assignee: Nanjing University, Nanjing (CN)

( * ) Notice: Subject to any disclaimer, the term of this patent is extended or adjusted under 35 U.S.C. 154(b) by 0 days.

(21) Appl. No.: 13/977,718

(22) PCT Filed: Dec. 30, 2011

(86) PCT No.: PCT/CN2011/085067
§ 371 (c)(1),
(2), (4) Date: Jun. 30, 2013

(87) PCT Pub. No.: WO2012/092828
PCT Pub. Date: Jul. 12, 2012

(65) Prior Publication Data
US 2013/0295703 A1    Nov. 7, 2013

(30) Foreign Application Priority Data
Jan. 6, 2011    (CN) .......................... 2011 1 0001786

(51) Int. Cl.
| | | |
|---|---|---|
| *H01L 21/00* | (2006.01) | |
| *G02B 6/26* | (2006.01) | |
| *G02B 6/42* | (2006.01) | |
| *G02B 6/34* | (2006.01) | |
| *G02B 27/00* | (2006.01) | |
| *G02B 5/18* | (2006.01) | |
| *H01S 5/20* | (2006.01) | |
| *G02B 6/122* | (2006.01) | |

(52) U.S. Cl.
CPC ............ *H01S 5/2031* (2013.01); *G02B 5/1857* (2013.01); *G02B 5/1823* (2013.01); *G02B 6/1225* (2013.01)
USPC ................... 438/32; 438/31; 385/27; 385/37; 385/15; 359/578; 359/579; 708/400

(58) Field of Classification Search
USPC ............. 438/32, 31; 385/27, 37, 15; 359/578, 359/579; 708/400
See application file for complete search history.

(56) References Cited

U.S. PATENT DOCUMENTS

| | | | | |
|---|---|---|---|---|
| 5,852,688 A * | 12/1998 | Brinkman et al. | .............. | 385/16 |
| 6,067,391 A * | 5/2000 | Land | ............................... | 385/27 |
| 6,285,813 B1 * | 9/2001 | Schultz et al. | .................. | 385/37 |
| 6,393,172 B1 * | 5/2002 | Brinkman et al. | .............. | 385/16 |
| 6,640,034 B1 * | 10/2003 | Charlton et al. | .............. | 385/122 |
| 7,454,103 B2 * | 11/2008 | Parriaux | ......................... | 385/37 |
| 2005/0033787 A1 * | 2/2005 | Stepanov et al. | ............. | 708/400 |
| 2008/0069497 A1 * | 3/2008 | Tissot et al. | .................... | 385/37 |

FOREIGN PATENT DOCUMENTS

| | | |
|---|---|---|
| CN | 200410007530.5 A | 1/2005 |
| CN | 200410009167.0 A | 2/2005 |
| CN | 101924326 A | 12/2010 |
| CN | 102147492 A | 8/2011 |

OTHER PUBLICATIONS

Yating Zhou et al. Equivalent A-/4 Phase Shift to Improve the Single Longitudinal Mode Property of Asymmetric Sampled Bragg Grating Semiconductor Laser. Microwave Photonics, 2010 IEEE Topical Meeting. pp. 89-92, ISBN 978-1-4244-7825-5.

Xu Mai, Research Progress on Waveguide Gratings for integrated Optics "Chinese Journal of Luminescence ",2005, 26 (4) ; 415-425.

Jose M. Castro, David F. Geraghty, Seppo Honkanen, Christoph M. Greiner, Dmitri Iazikov, and Thomas W. Mossberg, Optical add-drop multiplexers based on the antisymmetric waveguide Bragg grating, Applied Optics, 2006,45(6); 1236-1243.

Ming Li, Yaming Wu, Jiangyi Yang, and Hongchang Qu, Return loss reduction of integrated grating-assisted optical Add/Drop multiplexer by control the reflective spectrum, Journal of lightwave technology , 2005, 23(3): 1403-1409.

Jose M. Castro, David F. Geraghty, Demonstration of mode conversion using anti-symmetric waveguide Bragg gratings, Optics Express, 2005, 13(11): 4180-4184.

Yitang Dai, Xiangfei Chen, Li Xia, Yejin Zhang, and Shizhong Xie, Sampled Bragg grating with desired response in one channel by use of reconstruction algorithm and equivalent chirp, Optics Letters, 2004, 29(12): 1333-1335.

Yitang Dai and Xiangfei Chen, DFB semiconductor lasers based on reconstruction-equivalent-chirp technologyOptics Express, 2007,15(5) : 2348-2353.

Jingsi Li,Huan Wang, Xiangfei Chen, Zuowei Yin, Yuechun Shi, Yanqing Lu, Yitang Dai and Hongliang Zhu, Experimental demonstration of distributed feedback semiconductor lasers based on reconstruction-equivalent-chirp technology. Optics Express, 2009, 17(7) : 5240-5245.

Jingsi Li, Xiangfei Chen, Ningzhou, etc, Monolithically integrated 30-wavelength DFB laser array, Proc.of SPIE-OSA-IEEE, 2009, SPIE 7631, 763104.

J.A. Armstrong, N. Bloembergen, J.Ducuing, and P.S.Pershan. Interactions between light waves in a nonlinear dielectric, Physical review, 1962, 127(6) : 1918-1939.

Shi-ning Zhu, Yong-yuan Zhu, Nai-ben Ming, Quasi-Phase-Matched third-harmonic generation in a quasi-periodic optical superlattice, Science, 1997, 278 (843).

The first office action for corresponding Chinese application CN 201110104875.2, dated Nov. 30, 2011.

\* cited by examiner

*Primary Examiner* — Evan Pert
*Assistant Examiner* — Gustavo Ramallo
(74) *Attorney, Agent, or Firm* — Treasure IP Group

(57) ABSTRACT

A method for manufacturing a multi-dimensional target waveguide grating and volume grating with micro-structure quasi-phase-matching. An ordinary waveguide grating is used as a seed grating, and on this basis, a two-dimensional or three-dimensional sampling structure modulated with a refractive index, that is, a sampling grating, is formed. The sampling grating comprises multiple shadow gratings, and one of the shadow gratings is selected as a target equivalent grating. A sampled grating comprises Fourier components in many orders, that is, shadow gratings, a corresponding grating wave vector is [Formula 1], and the grating profile of all the shadow gratings changes with the sampling structure [Formula 2]. In a case where a seed grating wave vector [Formula 3] and a required two-dimensional or three-dimensional grating wave vector do not match, a certain Fourier periodic structure component of the Fourier components of the sampling structure is used to compensate for the wave vector mismatch. The manufacturing method may be applied to design and manufacture a multi-dimensional target waveguide grating and volume grating for any grating profile, and may simplify the grating manufacturing process and also make possible a variety of grating-based photon devices.

13 Claims, 13 Drawing Sheets

METHOD FOR MANUFACTURING MULTI-DIMENSIONAL TARGET WAVEGUIDE GRATING AND VOLUME GRATING WITH MICRO-STRUCTURE QUASI-PHASE-MATCHING

CROSS REFERENCE TO RELATED APPLICATION

This application is a National Phase application of, and claims priority to, PCT Application No. PCT/CN2011/085067, filed on Dec. 30, 2011, entitled "METHOD FOR MANUFACTURING MULTI-DIMENSIONAL TARGET WAVEGUIDE GRATING AND VOLUME GRATING WITH MICRO-STRUCTURE QUASI-PHASE-MATCHING", which claimed priority to Chinese Application No 201110001786.5, filed on Jan. 6, 2011. Both the PCT Application and Chinese Application are incorporated herein by reference in their entireties.

TECHNICAL FIELD

This invention belongs to the field of optoelectronic technology involving fiber-optic communications, photonic integration, photoelectric sensing as well as other optoelectronic information processing technologies. The main idea of the invention is to propose the micro-structure of quasi-phase matching technology (i.e. MS-QPM) with which we can equivalently realize any target grating structure for the two-dimensional planar waveguide Bragg grating or three-dimensional volume grating using the sampling structure. Based on this design idea, the applicants also propose a variety of new photonic devices such as new wavelength division multiplexer or filter without retro-reflection, tilted waveguide grating, DFB semiconductor lasers with suppressed $0^{th}$ channel based on the reconstruction equivalent chirp technology as well as directional coupler and power splitters.

BACKGROUND

With the advancement of computer network technology, the demand for information is increasing exponentially. Over the past decade, the fast development of Internet and the accompanying huge requirement for information transmission not only call for a more advanced fiber communication system, but also demands the development of advanced fiber communication technology. This is especially true for optical communication devices. This new demand requires new theories and cost-effective devices to support the further development of optical networks. Fortunately, the photonic integration circuits (PICs) technology developed in recent years conforms to the development of times and is opening a new era of optical networks. PICs technology is considered to be the cutting-edge and the most promising technology of optical communications. In the Silicon Valley of the United States of America, Infinera Corporation has realized the integration of a large number of complex optoelectronic integrated devices with indium phosphide and other materials, lowering the cost of optical communication while increasing its capacity. In the field of passive optical devices, Bragg grating waveguide shows an excellent property of wavelength selectivity and has been used in a variety of optical communication devices and photonic integrated devices, such as planar integrated Bragg grating waveguide filter [1] with which multiplexer/demultiplexer or filter of light signal with different wavelengths waveguide grating assisted components (OADM) [2-3], tilted waveguide grating mode converter, etc. [4] are achieved. In actual design, it is necessary to achieve different functions of the waveguide grating in a single photonic chip, which means different grating profiles have to be written individually for different functions. In particular, in order to achieve different grating directions, cycles, phase shifts, chirps and even arbitrary structures in the same chip, the traditional low-cost holographic exposure is almost impossible to actualize. Therefore, more advanced nano-fabrication technology, such as electron beam (E-Beam) lithography, is often utilized. However, the high cost and time-consuming properties of E-Beam lithography have increased the difficulty and cost of fabrication and limited its large-scale implementation.

In order to solve this practical problem, Chen Xiangfei et al first proposed an effective solution to simplify the fabrication of fiber gratings, and they called it "Reconstruction-Equivalent-Chirp (REC) technology" [5-6]. With this technology, we can fabricate a nano-scale grating structure with micron-scale precision. This method has also been successfully applied to the design and fabrication of the distributed feedback (DFB) semiconductor laser and the DFB laser array [7-9], which provides an effective solution for high performance of semiconductor laser array in photonic integration. In order to further solve the monolithic integration problem of different waveguide gratings with complex structure in the planar photonic integration and to lower the fabrication costs, based on the previous research of the applicants of this invention, the applicants propose a micro-structure quasi-phase matching (MS-QPM) technology. This technology not only provides a new method of design and fabrication of the waveguide grating with two or three dimensions, but also gives some novel grating structure and corresponding optical properties of waveguide gratings or volume gratings. For instance, we can change the grating period and even rotate the grating directions equivalently and simultaneously by sampling in the same seed grating. The REC technology is a special one-dimensional case of the micro-structure of quasi-phase matching (MS-QPM) [5]. The mathematical expression of this technology shares some similarities with the famous quasi-phase matching (QPM) described in non-linear optical materials [10,11], and therefore it can be considered as a new discovery and development of quasi-phase matching technology. In summary, this technology can achieve arbitrary shape of two or three-dimensional gratings by changing the large-scale sampling structure while keeping the seed grating period unchanged. Any of the physical achievable of two or three-dimensional grating structure can be achieved as long as the two or three dimensional gratings design is used by sampling structure with micrometer scale and uniform seed grating. With this structure we can achieve a variety of optical properties of the waveguide grating or volume grating with the fine grating structures. We only need to change the sampling structure while keep the seed grating uniform. The sampling structure size is normally a few micrometers, the implementation of this method only requires a standard holographic exposure technique with conventional photolithography technique. This greatly eases fabrication process and substantially improves productivity and product quality. The idea of two or three-dimensional sampled grating structures can be used to design new photonic devices, such as wavelength division multiplexer, which until now are array waveguide grating (AWG) and multimode interference (MMI) in the mainstream market. These existing devices have high requirement for waveguide accuracy, aside from relatively large size. Based on this two-dimensional sampling structure, combined with Bragg grating reflection principle, we can make a new compact wavelength division multiplexer.

In addition, some other photonic devices such as filter without retroreflection, DFB semiconductor lasers with suppressed $0^{th}$ channel resonance based on the Reconstruction-Equivalent-Chirp technology, directional coupler and power splitters of any angle, optical waveguide mode converter, any other photonic devices based on waveguide grating and the volume grating, can be achieved. We believe this method can open a new avenue and bring a new dawn to the design of planar photonic integration and other relative photonic devices.

The main idea of this invention is to propose the microstructure of quasi-phase matching technology. Based on this technology, the target waveguide grating or volume waveguide grating with any grating shape and the corresponding photonic devices can be achieved by two or three-dimensional sampling structures using a uniform grating.

SUMMARY OF THE INVENTION

A method to fabricate a multi-dimensional target waveguide and volume grating. Any kind of two or three dimensional (2D or 3D) target grating with arbitrary grating structure can be realized if it is physically realizable. The common waveguide Bragg grating or volume grating is used as the seed grating. Its period can be uniform and varies from 50 nm to 1000 nm. The 2D or 3D sampled grating is then formed with refractive-index-modulated sampling structure. Among the multiple ghost gratings or sub-gratings in the sampled grating structure, one is selected as the target equivalent grating. The wave-vector of the seed grating is $\vec{K}_0(\vec{r})$, the wave-vector of the light is $\vec{K}$ and the wave vector difference between light and the seed grating is $\Delta \vec{K}$ which can be expressed as $$\Delta \vec{K} = \vec{K} - \vec{K}_0(\vec{r}) \quad (1)$$

The refractive index modulation of the sampled grating with arbitrary sampling structure and uniform seed grating can be expressed as, $$\Delta n_s(\vec{r}) = S[\vec{r}] \cdot \Delta n(\vec{r}) \quad (2)$$

Here $S[\vec{r}]$ is the sampling structure and $\Delta n(\vec{r})$ is the refractive index modulation depth of the seed grating; $\vec{r}$ denotes the space vector. Based on the Fourier analysis, equation (2) can be further expressed as, $$\Delta n_s(\vec{r}) = \sum_{n=-\infty}^{n=+\infty} C_n(\vec{r}) \exp\left(j \int \vec{G}_{sn}(\vec{r}) \cdot d\vec{r}\right) \Delta n \exp\left(j \int \vec{K}_0(\vec{r}) \cdot d\vec{r}\right) = \sum_{n=-\infty}^{n=+\infty} C_n(\vec{r}) \Delta n \exp\left(j \int \vec{K}_n(\vec{r}) \cdot d\vec{r}\right) \quad (3)$$

Here j denotes an imaginary number, $\vec{G}_{sn}(\vec{r})$ is the wave-vector of the $n^{th}$ order Fourier component of the sampling structure; $\vec{K}_0(\vec{r})$ is the wave-vector of the seed grating and it can be further expressed as $$\vec{K}_0(\vec{r}) = \frac{2\pi}{\Lambda(\vec{r})} \vec{e}_0 \cdot \Lambda(\vec{r})$$

is the period of the seed grating and $\vec{e}_o$ denotes the direction of the seed grating. $C_n(\vec{r})$ is the Fourier coefficient, n denotes the $n^{th}$ Fourier order and describes all the Fourier components of the sampled grating, i.e. the ghost gratings or sub-gratings. According to Eq.(3), there are a series of ghost gratins in the sampled grating with their wave-vector $\vec{K}_n(\vec{r})$. All of these ghost gratings can be changed with the sampling structure $S[\vec{r}]$. And $n^{th}$ order wave-vector of the ghost grating $\vec{K}_n(\vec{r})$ corresponds to the summation of the wave-vectors of the seed grating $\vec{K}_o$ and of the $n^{th}$ order sampling structure's Fourier sub-grating $\vec{G}_{sn}(\vec{r})$. According to equation (3), the wave-vector of the target equivalent grating) $\vec{K}_N(\vec{r})$ can be expressed as, $$\vec{K}_N(\vec{r}) = \vec{G}_{sN}(\vec{r}) + \vec{K}_0(\vec{r}) \quad (4)$$

If the wave-vector of the target equivalent grating $\vec{K}_N(\vec{r})$ equals to the wave-vector of the target grating $\vec{K}_d(\vec{r})$, that is, $\vec{K}_N(\vec{r}) = \vec{K}_d(\vec{r})$. $\vec{K}_o(\vec{r})$ is the wave-vector of the seed grating, $\vec{G}_{sN}(\vec{r})$ is the wave-vector of the target sampling structure's Fourier sub-grating, $\vec{K}_N(\vec{r})$ can be changed with the sampling structure: By changing the periodic distribution of the sampling structure $S[\vec{r}]$, the wave-vector $\vec{G}_{sN}(\vec{r})$ can be varied, then the arbitrary target grating structure can be equivalently realized. In other words, when the wave-vector of the seed grating $\vec{K}_0(\vec{r})$ mismatches the wave-vector of the required 2D or 3D target grating, one of the Fourier sub-gratings in the sampling structure i.e., the wave-vector of the target sampling structure's Fourier sub-grating $\vec{G}_{sN}(\vec{r})$ is used to compensate this mismatch. Therefore, an additional target sampling structure's Fourier sub-grating is employed here to keep the phase difference equals to zero during the optical transmission process, and the following phase match is also satisfied.

$$\vec{K}_d - \vec{K}_0(\vec{r}) - \vec{G}_{sN}(\vec{r}) = 0 \quad (5)$$

According to Eq.(3), the phase of the sampled grating is also a function of space. Specially the phase of the uniform ghost grating can be expressed as, $$\exp[j\vec{G}_{sn} \cdot \vec{r}] \exp(j(\vec{K}_0 \cdot \vec{r})) \quad (6)$$

If there is a phase shift in the sampling structure, and the shift value is $\Delta \vec{r}'$, a phase shift will also exist in the sampling structure's Fourier sub-grating. The corresponding phase of the ghost grating can be described as, $$\exp[j\vec{G}_{sn} \cdot (\vec{r} + \Delta \vec{r}')] \exp(j(\vec{K}_0 \cdot \vec{r})) = \exp[j\vec{G}_{sn} \cdot (\vec{r})] \exp(j(\vec{K}_0 \cdot \vec{r})) \exp(j\vec{G}_{sn} \cdot \Delta \vec{r}') \quad (7)$$

The corresponding phase shift of the ghost-grating has a magnitude of $\exp(j\vec{G}_{sn} \cdot \Delta \vec{r}')$.

For a uniform seed grating, $\vec{G}_{sn} \cdot \Delta \vec{r}' = \phi$. So a phase shift $\phi$ is introduced in the $n^{th}$ order ghost grating of the sampled grating.

The refractive-index modulation, which corresponds to the Fourier coefficient $C_n(\vec{r})$, can also be changed with the pattern or shape in one sampling period, such as the duty cycle. In the 2D case, the refractive-index modulation can also be equivalently changed by this method. The suitable shape in one sampling period to get the largest refractive-index modulation intensity can be obtained from the Fourier analysis.

The characteristic of the MS-QPM technology as described in claim 1: the target equivalent grating with arbitrary structures, such as the tilted/arc grating or chirped/phase shifted grating is realized by the MS-QPM technology, as long as the grating structure is physically realizable. There are a series of Fourier components, which are called ghost gratings, with their wave-vectors Of $\vec{k}_n(\vec{r})$ in the sampled grating structure. According to Eq.(4) and (5), in order to obtain a specific target equivalent grating, i.e., the ghost grating with a certain Fourier order, the corresponding sampling structure, i.e., sampling period distribution, should be designed via composing the grating wave-vectors. Furthermore, according to Eq.(4), to change the direction of the grating, the target equivalent grating with arbitrary directions or arc profiles can be realized by changing the direction of the wave-vector of sampling structure's Fourier sub-grating $\vec{G}_{sN}(\vec{r})$. In addition, to realize the multiple-dimension phase shifted grating, only the phase shift in the sampling structure is required according to Eq.(5)-(7). In contrast, to realize the chirped grating, the sampling period and direction of the sampling structure are needed to be changed in space. For the fabrication process, the period of the uniform seed grating is usually in the order of several hundred nanometers, thus it facilitates the fabrication process via the traditional holographic exposure by interference method, or by means of the near field holographic exposure. In contrast, the scale of the sampling structure is usually in the order of several micrometers, which is also very straightforward to be fabricated using the common photolithography technology.

In the present invention, the characteristics of the MS-QPM technology as applied to fabricate the WDM multiplexer/demultiplexer based on the waveguide grating or the volume grating are the two methods to design the multiplexer/demultiplexer. The first method is the cascade sampling structure which consists of several sections in the two dimensional waveguide grating. Each section is of the particular sampling structure including particular sampling period and direction of the corresponding wave-vector. So the target equivalent grating in each section of the sampled grating diffracts a light beam with certain frequency (Bragg wavelength), while the seed grating keeps uniform. The second method is adopting the sampled grating with chirped seed gating. The seed grating is chirped and the sampling structure keeps uniform. Therefore, by the aid of different target equivalent gratings in different sections of the sampled grating, the light with different frequencies (wavelengths) will be reflected in different directions. Hence, the demultiplexer can be achieved. On the other hand, the lights with different frequencies (wavelengths) propagating in given directions and positions, will be reflected in the same direction and couple into one single waveguide, following the Bragg diffraction conditions. So the multiplexer can be realized. The total cavity length of the multiplexer/demultiplexer devices are determined by the number of the channels. Usually, the sampling period of the multiplexer/demultiplexer grating varies from 0.5 to 20 μm for a two-dimensional waveguide.

In the present invention, Bragg grating filter can be fabricated based on the MS-QPM technology. If there are two equivalent πphase shifts inserted in the 1/4 and 3/4 positions of the target equivalent grating, a narrow pass-band will be established in the middle of the stopband. The equivalent πphase shift can be realized by Eq. (5) to (7). Usually the cavity length varies from about 50.0 μm to 5000.0 μm, the corresponding refractive index modulation intensity is 0.2 or larger. The stopband of the transmission light is up to 40 nm or even wider, which can cover one whole optical communication window.

In the present invention, the DFB semiconductor laser based on Reconstruction-equivalent-chirp (REC) technology with the suppressed $0_{th}$ order resonance can be fabricated. The period of the seed grating keeps uniform but tilted with an included angle (2° to 15°) between the direction of the wave-vector $\vec{K}_0(\vec{r})$ and the axial direction of the waveguide working as resonant cavity. Correspondingly, the designed sampling structure is also tilted with some tilted angle, Therefore, according to Eq.(4), the direction of the target equivalent grating's wave-vector $\vec{k}_N(\vec{r})$ will be rotated to be parallel to the axial direction of the resonant cavity. When designing, the Fourier order N is usually equal to ±1. The specific tilted angle of the seed grating wave-vector $\vec{k}_0(\vec{r})$ can be determined according to the effect on the suppression of $O_{th}$ order channel's resonance. Usually the tilted angle is from 2° to 15°, which enables a good suppression. The detailed designing parameters of the seed grating and the sampling structure can be determined according to Eq.(4). The period of the sampling structure usually varies from 0.5 to 20 μm. The larger title angle will lead to a better suppression effect. When the tilted angle is larger than 10°, the light resonance of the $O_{th}$ order channel can be fully suppressed.

In the present invention, the tilted waveguide grating can be fabricated with the following characteristic: The uniform seed grating is used and the direction of the wave-vector $\vec{k}_0(\vec{r})$ is designed according to the actual requirement. The sampling period is also uniform but there is a tilted angle between the wave-vector of the target sampling structure's Fourier sub-grating $\vec{G}_{sN}(\vec{r})$ and the seed grating. Hence, there will be a tilted angle between the wave-vector of the target equivalent grating $\vec{k}_N(\vec{r})$ and the axial direction of the waveguide according to Eq.(4). This tilted angle is usually designed to be from 2° to 15°.

In the present invention, the power divider with arbitrary power division ratio, and the directional coupler with arbitrary coupling direction, can be fabricated based on the MS-QPM technology. The sampling structures are different in different sections of the waveguide for the power divider or the directional coupler. The corresponding target equivalent gratings with different directions in different sections of the waveguide will reflect incident light with a specific wavelength along different directions. Each of the reflective directions can be designed on purpose. The detailed parameters can be calculated according to Eq.(4). Therefore, the directional coupler can be realized. If the refractive-index modulation is properly designed, the sampled grating only reflects a portion of the incident light power. Then, the power divider can be obtained.

The refractive-index modulation intensity is usually designed from 0.001 to 0.2. The larger refractive-index modulation intensity of the target equivalent grating will lead to a higher diffractive efficiency.

In the present invention, the arbitrary volume grating filter and volume grating based photonic device can be fabricated based on the MS-QPM technology, The seed grating keeps uniform and the sampling structure can be realized by photomask using the common photolithography method. The sampling structure can be designed according to the equations from Eq.(3) to Eq.(7). Therefore, the required target grating structure can be realized by the target equivalent grating.

In the present invention, the waveguide grating based photonic device with fine grating structure can be fabricated based on the MS-QPM technology. The uniform seed grating can be fabricated by holographic exposure. The required target equivalent grating can be obtained by designing the sampling structure according to the equations from Eq.(3) to Eq.(7). The sampled grating can be realized by the common photolithography method. Therefore, various waveguide grating based photonic devices can be easily realized.

In the present invention, the photonic integrated circuits with DFB semiconductor laser array based on REC technology, the waveguide grating filters, coupler and multiplexer/demultiplexer can be monolithically integrated on the same chip, All the devices listed above can share the same seed grating, while the sampling structure can be designed separately according to the equations Eq. (3) to Eq.(7). Consequently, the whole sampling structure can be fabricated on the same mask. Therefore, the whole sampled grating on that chip can be realized at the same time to achieve the monolithic integration of different photonic elements.

In the present invention, 8-channel WDM Multiplexer/Demultiplexer based on the multiple sections (layers) sampled grating structure can be fabricated. The core of the two-dimensional planar waveguide is made of Ge:SiO$_2$ with the effective refractive index equal to 1.455. The refractive index modulation of the seed grating is 0.006. The width of the device is 40 μm along X direction. The length of each section is 100 μm. The total length of the device is 1200 μm along Z axis. The direction of the wave-vector $\vec{K}_0(\vec{r})$ of the seed grating is parallel to the +Z direction with the grating period of 500 nm. The channel spacing is 2 nm and the operating wavelength is from 1544 nm to 1558 nm. The incident polychromatic light is also parallel to the +Z direction. The detailed design parameters are listed in the following Table. 1.

Table.1. the channel wavelength/ sampling period/ The included angle between wave-vector $\vec{G}_{sN}(\vec{r})$ of the sampling structure and the wave-vector of the seed grating/the Corresponding reflective angle between the –Z direction.

| Channel wavelength | Sampling period | Included angle between $\vec{G}_{sN}(\vec{r})$ and $\vec{K}_0(\vec{r})$ | Included angle between the Reflective Light and –Z direction |
|---|---|---|---|
| 1544 nm | 4.20 μm | 55° | 11.95° |
| 1546 nm | 4.00 μm | 56° | 12.71° |
| 1548 nm | 3.85 μm | 56° | 13.42° |
| 1550 nm | 3.60 μm | 57° | 14.36° |
| 1552 nm | 3.30 μm | 58° | 15.90° |
| 1554 nm | 3.20 μm | 58° | 16.44° |
| 1556 nm | 3.10 μm | 58° | 17.00° |
| 1558 nm | 3.00 μm | 58° | 17.62° |

Here, the +1$^{st}$ ghost grating works as the target equivalent grating. As the wave-vector of the seed grating and the incident light are all parallel to the +Z direction, all of these included angles can be either clockwise or counterclockwise. The sampling structures of these two cases appear to be of mirror symmetry regarding to +Z direction.

A directional coupler with power division ratio of 0.5 can be fabricated: The width of the device is 30 μm along the X axis and the length of the device is 50 μm along the Z axis. The material of the core layer is Ge:SiO2 with the effective refractive index of 1.455. The thickness of the core layer is 2 μm. The wave-vector of the seed grating $\vec{K}_0(\vec{r})$ is parallel to the +Z direction with the period of 485 nm. The incident light with the wavelength of 1545.5 nm and the beam width of 30 μm propagate along the +Z direction. There is a diffractive beam with the diffractive efficiency of about 50% propagating along the designed direction with an angle of 15.74° between the direction of reflective direction and the -Z axial direction, while the rest 50% propagates along +Z direction, the corresponding refractive index modulation intensity is about 0.001. The sampling pattern is square wave with the duty cycle of 0.5. The included angle is 50° between the wave-vector of the sampling structure and that of the seed grating.

In the present invention, the DFB semiconductor laser based on the Reconstruction-Equivalent-Chirp technology with suppressed 0$^{th}$ channel can be fabricated. The effective refractive index is 3.1. The cavity length is 400 μm. The width of the ridge waveguide is 2 μm. The period of the seed grating is 238 nm. The sampling period is 3 μm. The angle between the wave-vector $\vec{G}_{sN}(\vec{r})$ and the axial direction of the waveguide is 53.67°. The angle between the seed grating wave-vector $\vec{K}_0(\vec{r})$ and the axial direction of the laser waveguide is 3.67° Both of the angle of $\vec{G}_{sN}(\vec{r})$ and $\vec{K}_0(\vec{r})$ with the axial direction of waveguide are clockwise or anti-clockwise. The direction of the wave-vector of $-1_{st}$ order target equivalent grating is parallel to the waveguide axial direction and its grating period is 250.27 nm, and the corresponding Bragg wavelength is 1551.71nm.

DESCRIPTION OF THE INVENTION

This invention proposes a technology named the microstructure quasi-phase-matching. This technology is used to fabricate the two dimensional (2-D) planar waveguide grating and the three dimensional (3-D) volume grating with complex grating corrugation profile. The arbitrary grating corrugation profile can also be equivalently achieved by designing the sampling structure and the seed grating with relatively small grating period. This technology simplifies the fabrication process and lowers the cost of production for the various photonic devices.

The description of the present invention are as follows:

The main characteristic of the invention is to use uniform grating period and uniform grating index modulation strength as the seed grating with grating period between 50 nm and 1000 nm. Then the sampling structure further modulates the seed grating's index corrugation to form the sampled grating structure. This sampled grating with specific sampling structure can equivalently realize the arbitrary 2-D or 3-D grating structure. Based on the Fourier series analysis, such a sampled grating contains a series of Fourier components. Each of these Fourier components can also be considered as a grating which is called ghost grating or sub-grating. If one of these ghost gratings is selected to perform a specific function, this ghost grating is called the target equivalent grating. When the wave-vector of the seed grating is described as $\vec{K}_0(\vec{r})$, the wave-vector difference $\Delta \vec{k}$ between the light $\vec{k}$ and the seed grating can be expressed as, $$\Delta \vec{k} = \vec{k} - \vec{K}_0(\vec{r}) \qquad (1)$$

When a light beam hit on a grating based device (either two or three dimensional), strong coupling will happen if some certain condition is satisfied. This condition is usually called the phase matching condition. Specifically, it can be written as $\Delta \vec{k} = \vec{k} - \vec{K}_0(\vec{r}) = 0$. If it is satisfied, the light will have the largest diffractive efficiency. This phenomenon is also called the Bragg diffraction.

Usually, the index corrugation of the seed grating can be expressed as $\Delta n(\vec{r}) = \frac{1}{2} \Delta n \exp(j\vec{K}_0 \cdot \vec{r}) + c.c.$ The corresponding sampled grating with arbitrary sampling structure can be expressed as, $$\Delta n_s(\vec{r}) = S[\vec{r}] \cdot \Delta n(\vec{r}) \quad (2)$$

Here, $S[\vec{r}]$ describes the sampling structure, $\Delta n(\vec{r})$ is the amplitude of the index modulation of the seed grating, $\vec{r}$ denotes the spatial vector. If the Fourier analysis is applied here, the Eq. (2) can be further expressed as $$\Delta n_s(\vec{r}) = \frac{1}{2} \sum_{n=-\infty}^{n=+\infty} C_n(\vec{r}) \exp\left(j \int \vec{G}_{sn}(\vec{r}) \cdot d\vec{r}\right) \Delta n \exp\left(j \int \vec{K}_0(\vec{r}) \cdot d\vec{r}\right) + c.c. = \frac{1}{2} \sum_{n=-\infty}^{n=+\infty} C_n(\vec{r}) \Delta n \exp\left(j \int \vec{K}_n(\vec{r}) \cdot d\vec{r}\right) + c.c. \quad (3)$$

Here j denotes imaginary unit, $\vec{G}_{sn}(\vec{r})$ are the wave-vectors of the $n^{th}$ Fourier components of the sampling structure. These Fourier components are called sampling structure's Fourier sub-grating. $\vec{K}_0(\vec{r})$ is the grating wave-vector of the seed grating and can be written as $$\vec{K}_0(\vec{r}) = \frac{2\pi}{\Lambda(\vec{r})} \vec{e}_0 \cdot \Lambda(\vec{r})$$

is the period of the seed grating. $\vec{e}_0$ denotes the direction of the seed grating. $C_n$ is the Fourier coefficients of each Fourier component. n denotes the order of the Fourier components. Therefore, $n^{th}$ order of the ghost gratings is characterized by wave-vector $\vec{K}_n(\vec{r})$. Obviously, all of these ghost gratings can be manipulated by changing the sampling structure $S[\vec{r}]$. This is because $\vec{K}_n(\vec{r})$ is only composed by seed grating's wave-vector $\vec{K}_0(\vec{r})$ and the wave-vector of sampling structure's Fourier sub-grating $\vec{G}_{sn}(\vec{r})$. For a certain order of the Fourier components of the sampled grating, i.e. n=N, the wave-vector transformation relation according to Eq. (3) can be expressed as $$\vec{K}_N(\vec{r}) = \vec{G}_{sN}(\vec{r}) + \vec{K}_0(\vec{r}) \quad (4)$$

Let $\vec{K}_N(\vec{r})$ be equal to $\vec{K}_d(\vec{r})$ of our desired grating or target grating, i.e. $\vec{K}_N(\vec{r}) = \vec{K}_d(\vec{r})$, then $\vec{K}_N(\vec{r})$ can be called as target equivalent grating wave-vector. Then, we call $\vec{G}_{sN}(\vec{r})$ target sampling structure's Fourier sub-grating wave-vector. $\vec{K}_d$ is the wave-vector of the target grating corresponding to the specific grating corrugation that we select to perform a specific function. The target equivalent grating is denoted by $\vec{K}_N(\vec{r})$ and can be easily manipulated by changing the sampling structure $S[\vec{r}]$. The detailed wave-vector transform procedure can be summarized as follows:

We first change the sampling pattern or sampling structure $S[\vec{r}]$ on purpose. Then, the wave-vector $\vec{G}_{sN}(\vec{r})$ can be changed accordingly. According to Equ. (4), the wave-vector of the target equivalent grating $\vec{K}_N(\vec{r})$ can also be changed. To carefully pre-design the sampling structure, the target equivalent grating can be same as the target grating. Therefore, the arbitrary grating profile can be realized equivalently only by changing the sampling pattern under a certain seed grating. In other words, we use one of the Fourier components of the sampling structure to compensate the wave-vector difference between the seed grating wave-vector $\vec{K}_0(\vec{r})$ and the target grating wave-vector $\vec{K}_d(\vec{r})$ when $\vec{K}_0(\vec{r})$ and $\vec{K}_d(\vec{r})$ is not equal. In general, this method is similar to the Quasi-phase-matching technology of the nonlinear optics for high order harmonic generation. In the nonlinear medium, an additional periodic structure is provided to compensate the wave-vector mismatch between the incident fundamental and the output high order harmonic light frequency. This transformation can contribute an additional momentum to satisfy the necessary of momentum conservation. By contrast, the Micro-structure Quasi-phase-matching technology has the similar physical picture and mathematical expression that can be expressed as follows:

$$\Delta \vec{k} = \vec{K}_d - \vec{K}_0(\vec{r}) - \vec{G}_{sN}(\vec{r}) = 0 \quad (5)$$

Here, $\vec{K}_d$ can be usually expressed as $\vec{K}_d = \vec{k}_{re} - \vec{k}_{in}$.

Furthermore, according to Eq. (3), the phase of the sampled grating is also a function of the space. For a certain ghost grating, the phase change can be expressed as $$\exp[j\vec{G}_{sn} \cdot \vec{r}] \exp(j(\vec{K}_0 \cdot \vec{r})) \quad (6)$$

Assuming there is a phase shift in the sampling structure, and the value of the shift is $\Delta \vec{r}'$, the phase of the sampled grating will be, $$\exp[j\vec{G}_{sn} \cdot (\vec{r} + \Delta \vec{r}')] \exp(j(\vec{K}_0 \cdot \vec{r})) = \exp[j\vec{G}_{sn} \cdot (\vec{r})] \exp(j(\vec{K}_0 \cdot \vec{r})) \exp(j\vec{G}_{sn} \cdot \Delta \vec{r}') \quad (7)$$

Then, a phase shift is easily introduced into the ghost grating. The corresponding phase shift is $\exp(j\vec{G}_{sn} \cdot \Delta \vec{r}')$. For example, if the seed grating is uniform and $\vec{G}_{sn} \Delta \vec{r}' = \phi$, a phase shift value $\phi$ is then introduced in the $n^{th}$ order ghost grating.

The index modulation strength of the target equivalent grating can be changed by changing the sampling structure shape in one sampling period such as the duty cycle. In the case of 2-D, we can continuously change the duty cycle of sampling structure along the grating, the equivalent apodization can be realized. The relation between the index modulation of a certain sub-grating and the duty cycle can be determined by the Fourier analysis.

When an optical signal is actually transmitted and processed, this optical signal has a certain bandwidth instead of a single frequency. That means this optical signal has a certain wavelength within a certain bandwidth. So the corresponding grating structures should be designed according to the process of the realistic optical signal to obtain the largest efficiency. For an actual optical signal, the specific grating is called as the target grating if we can get the best efficiency of single process. The wave-vector of the target grating is called as the wave-vector of the target grating $\vec{K}_d(\vec{r})$.

In most of the cases, the target grating is not a uniform grating. The period of the target grating is usually in the magnitude of a few hundreds of nanometers. Nanotechnology is needed to fabricate this grating. Meanwhile, the wavelength space of two channels of signals is usually smaller than 1 nm. This requires very high precision fabrication method and brings great difficulties to the massive fabrication for commercial application.

Because there is a one-to-one correspondence between the grating structure and its wave-vector, the key idea to obtain the target grating is how to design the corresponding target grating wave-vector $\vec{K}_d(\vec{r})$. This invention provides a method to achieve the target grating structure or the required wave-vector of the target grating $\vec{K}_d(\vec{r})$. Because the sampled grating still maintains the form of periodic structure, it is also a superposition of the Fourier components according to the Fourier analysis. Each Fourier component is called a ghost grating. Each wave-vector of these ghost gratings is a composite of the wave-vector of the seed grating and that of the sampling structure's Fourier sub-grating. Therefore, we can equivalently realize the target grating by designing the sampling structure to obtain a suitable wave-vector of the sampling structure's Fourier sub-grating. Here, the selected sampling structure's Fourier sub-grating is called the target sampling structure's Fourier sub-grating wave-vector. And the corresponding ghost grating with the same Fourier order of the sampled grating is called the target equivalent grating. In other words, the wave-vector of the target grating is equal to the vector composed by the wave-vectors of the target sampling structure's Fourier sub-grating and that of the seed grating. The seed grating can be fabricated by low cost traditional technologies, such as, holography exposure and near-field holography exposure to get the large area massive fabrication. The sampling structure can be achieved by using conventional photo-lithography.

Let us take two dimensional uniform planar waveguide grating as seed grating (any other grating structures can be used as the seed grating, we choose the uniform grating for the convenience of fabrication). The grating period usually ranges from 50 nm to 1000 nm. Base on such a seed grating, the two dimensional larger scale periodic structure (which is called the sampling structure) is further fabricated on it to form the sampled grating. If a certain order of ghost grating is selected as the target equivalent grating, the target waveguide grating or target volume grating can be equivalently achieved. The seed grating is common two dimensional or three dimensional Bragg grating, whose period is relatively small and usually a few hundred nanometers. In this invention, this kind of the basic gratings is called seed grating, because it only provides basic feedback of light instead of complex optical response. In practice, the seed grating can be of any shape and we conveniently fabricate the seed grating in uniform period by using holographic exposure. As a result, we always choose the uniform grating as the seed grating, then we sample the seed grating to form sampled grating and the sampling pattern can also be any shape principally. Because the sampling structure is also a kind of periodic structure, according to Eq. (3), there are many Fourier components. And all of their periods are equal or less than the period of the sampling structure. These Fourier components are also a series of gratings. If the seed grating is further modulated by the sampling structure, it can form the refractive index modulation with the sampling pattern. Such periodic refractive index modulation structure is the sampled grating, which is familiar to us.

When the wave-vector of the seed grating and the wave-vector of the target grating are not equal, we can change the sampling structure while keep seed grating unchanged. The mismatch between them can be compensated by using the wave-vector of the target sampling structure's Fourier sub-grating. This is similar to the quasi-phase matching in the nonlinear optics, which makes the phase difference in the transmission zero by an additional periodic modulation structure. This process is described in Eq. (5) for this invention. The mathematical expression and physical meaning of Eq. (5) is similar to that of the QPM in non-linear materials. Both of them use an additional periodic modulation structure to compensate their mismatch. In this invention, we use the sampling structure of large period to compensate the difference between the seed grating and the target grating. As a result, we match the wave-vector of the seed grating and that of the target grating, which is called the micro-structure quasi-phase match. Consequently, this invention is named Micro-Structure of Quasi-Phase Matching technology (MS-QPM technology).

Under physically realizable conditions, we can achieve the target equivalent grating of any grating structure by using the MS-QPM technology, especially the tilted/arc grating, chirp/phase shifted grating. The sampled grating contains a series of Fourier components. And the wave-vector of the ghost grating is $\vec{K}_n(\vec{r})$. According to Eq. (4) and (5), if we want to obtain a particular target equivalent grating, that is the ghost grating of a certain Fourier component, it can be composed by the wave-vectors of the seed grating and the sampling structure's Fourier sub-grating through corresponding design of the sampling structure. Specifically, in order to change the direction of grating, the target equivalent grating with the tilt/arc grating structure can be equivalently achieved by changing the direction of the wave-vector $\vec{G}_{sM}(\vec{r})$ of the sampling structure according to Eq. (4). To achieve the multi-dimensional phase shifted grating, the equivalent phase shift can also be realized by inserting the phase in the sampling structure according to Eq. (6) and (7). The chirped grating can also be equivalently realized according to Eq. (3) and (4) by changing the period and the direction of the sampling structure. Since the period of the uniform seed grating is usually several hundred nanometers, the seed grating is very easy to fabricate by the traditional holographic exposure with two beam interference or the near-field holographic exposure. The period of the sampling structure is usually several micrometers, so the sampling structure is also easy to fabricate by traditional photo-lithography. The whole fabrication process of a sampled grating with a specific sampling pattern is easily implemented with the MS-QPM technology.

There are two methods to design the WDM multiplexer/demultiplexer based on the MS-QPM technology. The first method is the cascade sampling structure which consists of several sections in the two dimensional waveguide grating. Each section of the particular sampling structure includes a particular sampling period and a particular direction of the corresponding wave-vector as shown in FIG. 3, while the seed grating is kept uniform. A light beam with certain frequency (Bragg wavelength) is diffracted from a certain section of the sampled grating. The second method is the sampled grating with chirped seed gating. As shown in FIG. 4, the seed grating is chirp and the sampling structure keeps uniform but there is a particular angle between them. Therefore, the light with different wavelength will be reflected in different directions by the different target equivalent gratings in the different sections of the sampled grating. Hence, the demultiplexer can be achieved. According to the reversibility of optical path, the lights with different wavelengths propagate in particular direction will be reflected in the same direction. So the multiplexer can be realized. The cavity length of the device is determined by the number of the channels. Usually, the sampling period is from 0.5 to 20 µm. The sampling period of the volume sampled grating based multiplexer/demultiplexer will be longer.

When fabricating the Bragg grating filter, two equivalent $\pi$ phase shifts are inserted at ¼ and ¾ of the length of the total cavity, this establishes a narrow passband in middle of the stopband. The equivalent $\pi$ phase shift can be realized by Eq. (6) and (7). The cavity length is between 50.0 μm to 5000.0 μm. The index modulation is 0.2 or larger. The stopband is up to 40 nm or even wider which can cover one whole optical communication window.

When we fabricate the DFB semiconductor laser based on the Reconstruction-Equivalent-Chirp (REC) technology with the $0^{th}$ order channel suppressed, the period of the seed grating is kept uniform but tilted with an include angle between the direction of the wave-vector $\vec{K}_0(\vec{r})$ and the axial direction of the waveguide working as resonant cavity. The titled angle is from 2° to 15°. If the designed sampling structure is also tilted with a certain tilted angle, the direction of the target equivalent grating's wave-vector $\vec{K}_N(\vec{r})$ will be rotated to be parallel to the axial direction of the resonant cavity. Here, N is usually equal to ±1. The specific tilted angle can be determined according to the effect on the suppression of $0^{th}$ order channel's resonance. Usually the tilted angle is from 3° to 15°, which will have a good effect on the suppression. The detailed parameters of the seed grating and the sampling structure can be determined according to Eq. 4. The period of the sampling structure is usually from 0.5 to 20 μm. The larger of the title angle will lead to a better suppression effect. When the tilted angle is larger than 10°, the light resonance of the $0^{th}$ order channel can be fully suppressed.

When we fabricate the tilted waveguide grating and the tilted waveguide grating based photonic devices, the uniform seed grating is used and the direction of the wave-vector $\vec{K}_0(\vec{r})$ is designed according to the actual requirement. The sampling period is also uniform but there is a tilted angle between the sampling structure and the seed grating. Hence, there will be a tilted angle between the target equivalent grating and the axial direction of the waveguide according to Eq. (4). This tilted angle is usually designed to be from 2° to 15°.

When we fabricate the power divider with arbitrary power division ratio and directional coupler with arbitrary coupling direction, the seed grating on the 2-D planar waveguide keeps uniform, and the sampling structures are different in different sections of the waveguide. The corresponding target equivalent gratings with different directions in different sections of the waveguide will reflect incident lights with specific wavelength on different directions. Each of the reflective directions can be designed on purpose. The detailed parameters can be calculated according to Eq. 4. Then, the directional coupler can be realized. If the index modulation is designed correctly, the sampled grating only reflects a portion of the incident light power. Therefore, the power divider can be obtained. The index modulation is usually designed to be from 0.001 to 0.2. The larger index modulation of the seed grating will lead to a high diffractive efficiency.

When we fabricate the arbitrary volume grating filter and volume grating based photonic device, the seed grating keeps uniform and the sampling structure can be realized by common photo-mask using the common photo-lithography. The sampling structure can be designed according to the equations from Eq. 3 to Eq. 7. Therefore, the required target grating can be realized by the target equivalent grating.

When we fabricate the waveguide grating based photonic device with fine grating structure, the seed grating can be fabricated by holographic exposure. The required target equivalent grating can be obtained by designing the sampling structure according to the equations from Eq. 3 to Eq. 7. The sampled grating can be realized by the common photo-lithography. Therefore, the various waveguide grating based photonic devices can be easily realized.

When we fabricate the monolithic photonic integrated circuits with DFB semiconductor laser array based on REC technology and the waveguide grating filters on the same chip, the DFB laser array and the waveguide grating can share the same seed grating and the sampling structure can be designed respectively according to the equations from Eq. (3) to Eq. (7). Consequently, the whole sampling structure can be fabricated on the same mask. Therefore, the whole sampled grating on that chip can be realized at the same time to achieve the different photonic elements integrated monolithically.

This invention benefits the fabrication of the various grating based photonic devices. The invention proposes a method named the Micro-Structure Quasi-Phase-Matching (MS-QPM) technology to fabricate the arbitrary required target multi-dimensional waveguide grating and volume grating with complex grating structure. A detailed description of the MS-QPM technology is presented in this invention. This technology requires only the uniform seed grating and the designed large scale sampling structure in order to greatly reduce the cost of fabrication.

PROCESS OF IMPLEMENTATION

The strength of the index modulation of the target equivalent grating can be varied by changing the duty cycle of the sampling structure. In the case of the one-dimensional sampled grating, the relationship between the strength of the index modulation of the target equivalent grating and the duty cycle of the sampling structure is described in the patent titled "Equivalent Apodized Planar Waveguide Grating and DFB Semiconductor Laser Based on the Reconstruction-equivalent-chirp Technology" (China Patent Application No. 200910264486.9). In the case of the two-dimensional sampled grating, the maximum strength of the index modulation of the target equivalent grating can also be obtained by using proper sampling structure. The specific structure can be calculated by the Fourier analysis.

Figure 1:
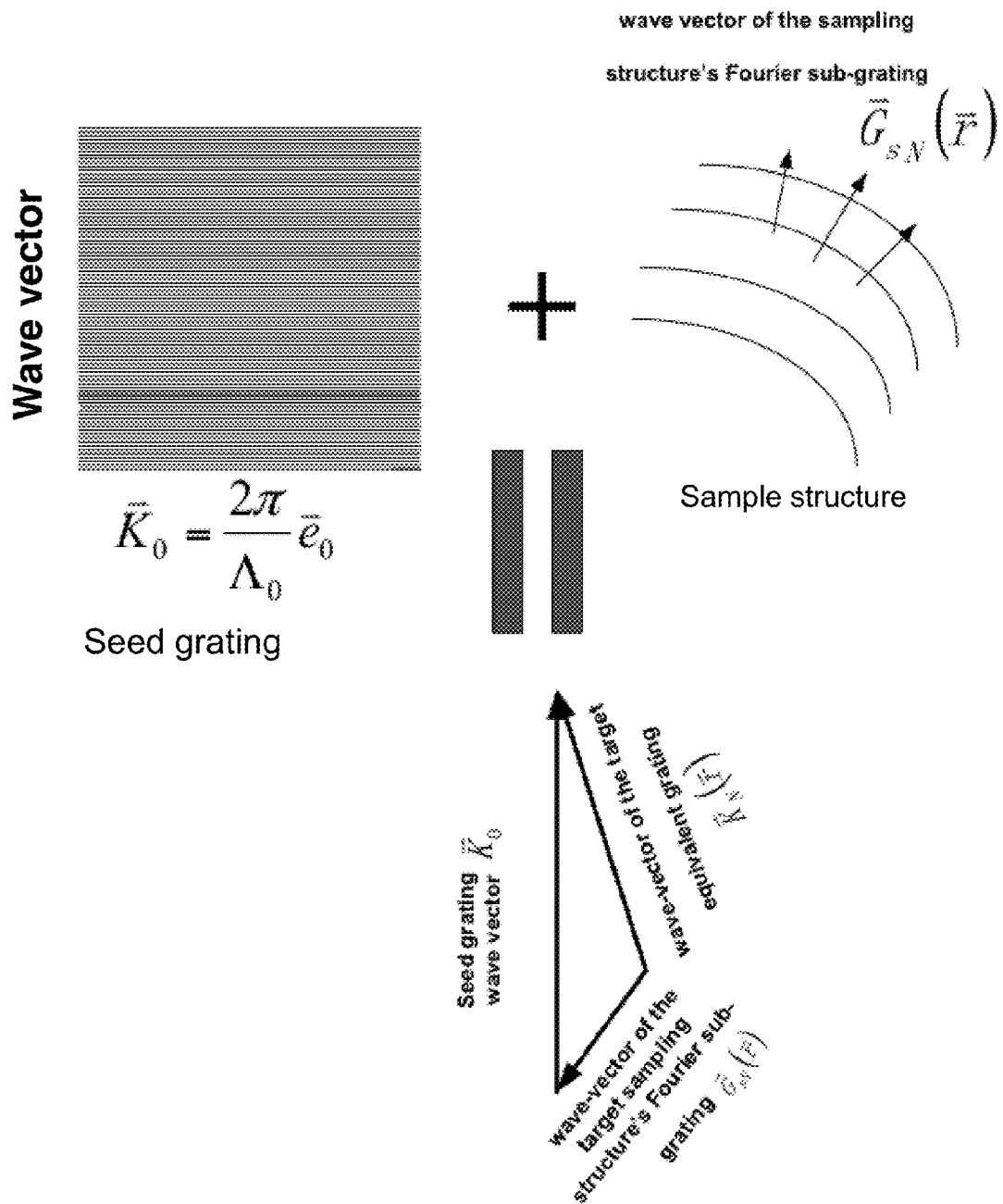
FIG. 1, the wave-vector transform diagram to form the target equivalent grating. The seed grating is uniform as an example.

As described in Eq. (3) to Eq. (5) that the wave-vector of the Fourier components $\vec{K}_n(\vec{r})$ of the sampled grating are composed by the corresponding order Fourier components $\vec{G}_{sn}(\vec{r})$ of the sampling structure and the seed grating's wave-vector $\vec{K}_0$. As shown in FIG. 1, the Fourier components of the sampled grating can be changed with the sampling structure which can be varied with space. Therefore, the arbitrary profile of the target equivalent grating can be equivalently realized by changing the sampling structure. The wave-vector $\vec{K}_d(\vec{r})$ of the target grating which includes grating direction and period can be arbitrarily changed.

Figure 2:
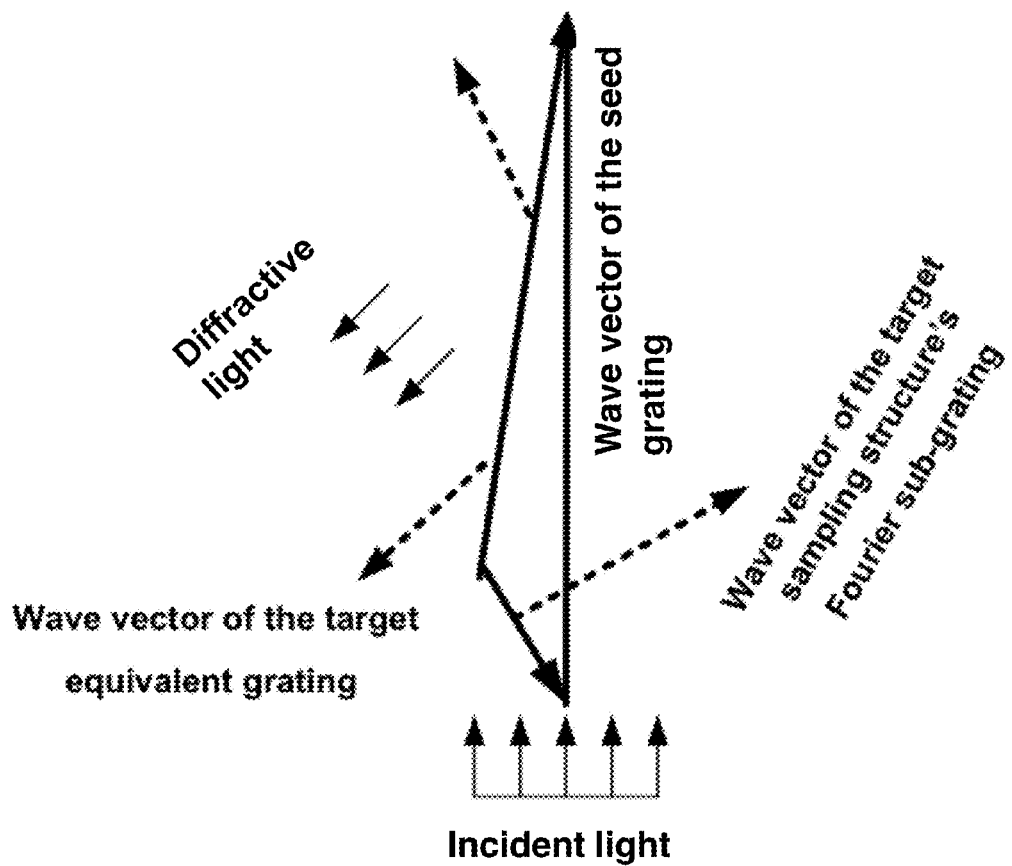
FIG. 2, the diagram of the interaction between the incident light and the target equivalent grating.

If the sampling structure is designed to be uniform, i.e. the wave-vector of the sampling structure is a constant, while there is an included angle between the wave-vector of the sampling structure and that of the seed grating, all of the ghost gratings are also uniform but rotating an angle according to Eq. (3) and Eq. (4). In this condition, a light beam which meets the Bragg condition with the target equivalent grating will diffract significantly in one certain direction as shown in FIG. 2.

When the required target grating is not uniform, i.e. changing with space, such as phase shift grating, chirped grating or curved grating, the wave-vector $\vec{G}_{sN}(\vec{r})$ of the target sampling structure's Fourier sub-grating is also required to change with space. Therefore, the target sampling structure's Fourier sub-grating or the sampling structure should be designed suitably to obtain the corresponding target equivalent grating which has the same grating profile with the target grating. As shown in Eq. (3), the phase of the sampled grating is also a function regarding space. According to Eq. (6) and Eq. (7), a phase shift in the sampling structure can also lead to a phase shift in the ghost grating. For example, if the relative shift is $\Delta \vec{r}'$ in some place of the sampling structure, a phase shift of $\phi = \vec{G}_{sN} \cdot \Delta \vec{r}'$ will be introduced in the $N^{th}$ order ghost grating.

All the above conclusions from two dimensional situation can be applied to the three dimensional cases as well. For example, the fabrication of the volume grating with complex grating structure will be greatly simplified with this design. Moreover, from Eq. (4), it also can be seen that the Reconstruction-Equivalent-Chirp technology is only the one dimensional case of this invention. For the other kinds of patterns of the seed grating and sampling structure such as the lattice structure which usually appears in photonic crystals or even the seed grating with arbitrary shapes, where $\vec{K}_0 = \vec{K}_0(\vec{r})$ is a function regarding space, the above conclusions are also true. The invention can be applied to any kinds of materials such as silicon-based materials and III-V group materials.

The above gives the basic method to equivalently obtain the target grating using Micro-structure quasi-phase matching technology. In the following, some detailed photonic devices based on Micro-structure quasi-phase matching technology are illustrated.

Grating structure used as WDM Multiplexer/Demultiplexer.

Figure 3:
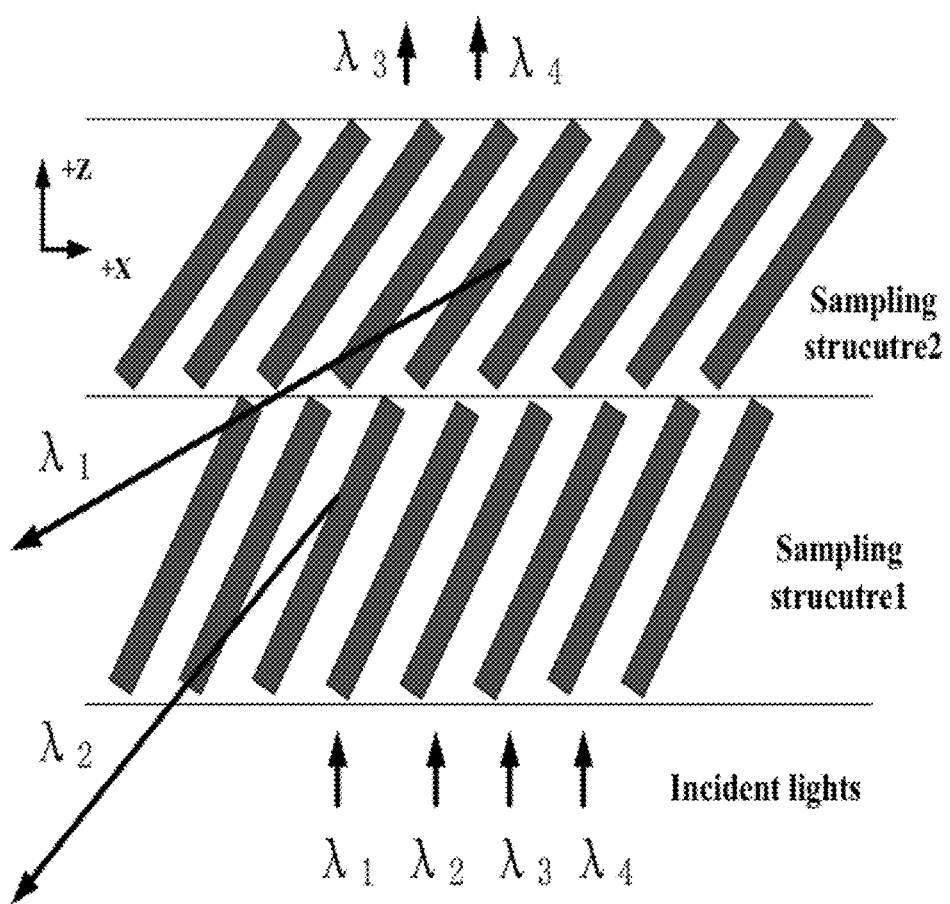
FIG. 3, the diagram of the cascaded sampled grating used as WDM multiplexer/demultiplexer. The seed grating is uniform.

(1) The Grating Structure of Multiple Layers Sampling (FIG. 3)

The two dimensional planar waveguide is divided into several sections or layers with different sampling structure in each section. All of these sections share the same uniform seed grating. But with the different sampling structures in each section, the target equivalent grating is also different. So, each section corresponds to a certain Bragg wavelength. The light with specific wavelength is reflected in different section of the device and propagates in the given direction. Therefore, the demultiplex will be realized. Based on the reversibility of optical path, if the light with different wavelength incident onto the device in the given direction, all of the light will be reflected in the same direction and coupled into the single waveguide though the diffraction for each light happens in different section of planar waveguide. So the Multiplex can be realized. This principle of the Multiplex/Demultiplex is also true for the volume grating.

Figure 4:
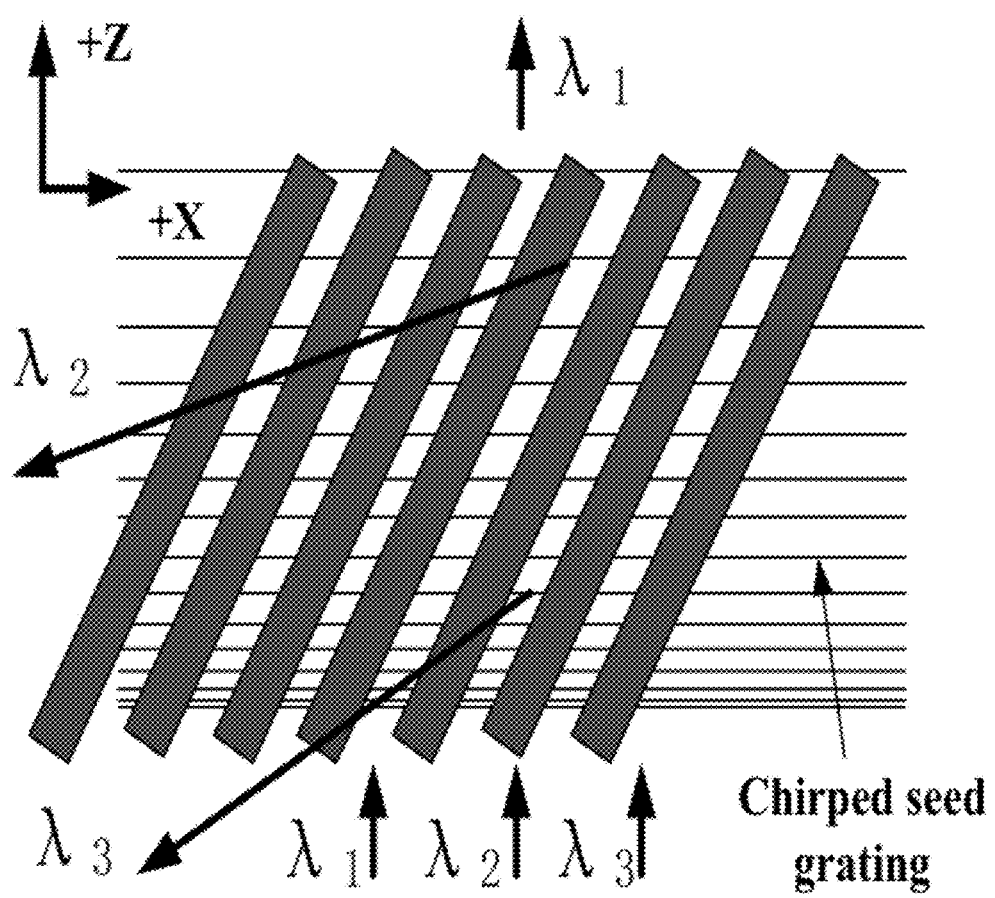
FIG. 4, the diagram of the sampled grating used as WDM multiplexer/demultiplexer with chirped seed grating.

(2) The Grating Structure of Chirped Seed Grating with Uniform Tilted Sampling (FIG. 4)

If the sampling structure is designed to be chirped, the corresponding target sampling structure's Fourier sub-grating also appears to be chirped. Therefore, the designed target equivalent grating is also of a special chirped profile with the direction and grating period varying with space. An alternative sample grating structure is that the seed grating being designed to be chirped but with uniform sampling structure. The resulting wave-vector $\vec{K}_N(\vec{r})$ of the target equivalent grating can also be chirped with varying direction. The incident lights with different frequencies can be diffracted on the different directions. Each light with specific frequency meets the Bragg condition in a certain region of the sample grating. So, the lights with different frequencies will be separated in respect of space and the demultiplex can be realized. Accordingly, the multiplex can be realized if the lights with different frequencies incident in the different direction at different place. These lights will prorogate at the same direction and couple into the single waveguide.

This two dimensional principle of the Multiplex/Demultiplex applies to the volume grating as well.

The following is one design example of the 8 channels WDM Multiplexer/Demultiplexer based on the multiple layers sampling grating structure.

The core material of this two-dimensional planar waveguide is Ge:SiO$_2$ with an effective refractive index of 1.455 and an index modulation of the seed grating of 0.006. FIG. 3 is the schematic diagram of the sampled grating. The width of the device is 40 μm along X direction. The length of each section of the unique sampling pattern is 100 μm. The total length of device along Z direction is 1200 μm. The direction of the wave-vector $\vec{K}_0(\vec{r})$ of the seed grating is parallel to the +Z direction with a grating period equal to 500 nm. The channel spacing is 2 nm and the operating wavelength ranges from 1544 nm to 1558 nm. The incident polychromatic light is parallel to the +Z direction. The detailed design parameters are listed in the following Table.1.

Table.1. the channel wavelength/sampling period/The included angle between wave-vector $\vec{G}_{sN}(\vec{r})$ of the sampling structure and the wave-vector of the seed grating/the Corresponding reflective angle between the −Z direction.

| Channel wavelength | Sampling period | Included angle between $\vec{G}_{sN}(\vec{r})$ and $\vec{K}_0(\vec{r})$ | Included angle between the Reflective Light and −Z direction |
|---|---|---|---|
| 1544 nm | 4.20 μm | 55° | 11.95° |
| 1546 nm | 4.00 μm | 56° | 12.71° |
| 1548 nm | 3.85 μm | 56° | 13.42° |
| 1550 nm | 3.60 μm | 57° | 14.36° |
| 1552 nm | 3.30 μm | 58° | 15.90° |
| 1554 nm | 3.20 μm | 58° | 16.44° |
| 1556 nm | 3.10 μm | 58° | 17.00° |
| 1558 nm | 3.00 μm | 58° | 17.62° |

The +1$^{st}$ ghost grating works as the target equivalent grating. Because the wave-vector of the seed grating and the incident light are all parallel to the +Z direction, all of these included angles can be either clockwise or counterclockwise. The corresponding sampling structures of these two different included angles are mirror symmetrical on Z axis.

Figure 5:
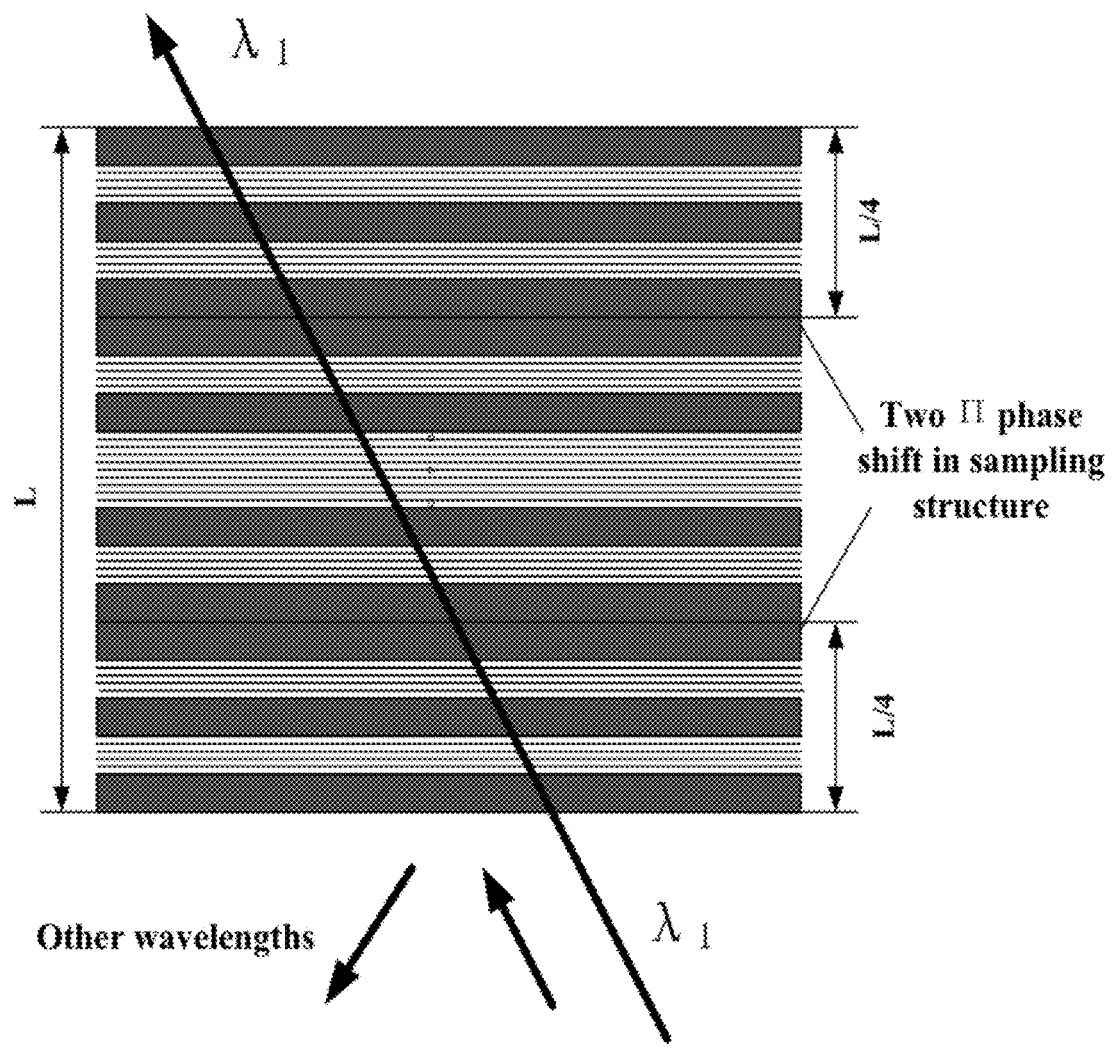
FIG. 5, the diagram of the filter with no retraced light.

2. Grating Filter with No Retraced Light. (FIG. 5)

If there are two equivalent π phase shifts inserted at ¼ and ¾ of the length of the total cavity, a narrow passband will be established in middle of the stopband. The equivalent π phase shift can be realized by Eq. (6) and (7). If the index modulation is increased to 0.2 or larger, the stopband could be increased to 40 nm or larger, which can cover the whole optical communication window. Thanks to the characteristic of the Bragg reflection, all of the lights outside of the passband will be reflected back in a certain direction instead of retracing. So the external feedback to the light source can be suppressed without using the optical circulator which is usually difficult to realize in photonic integrated circuits (PICs).

Figure 6:
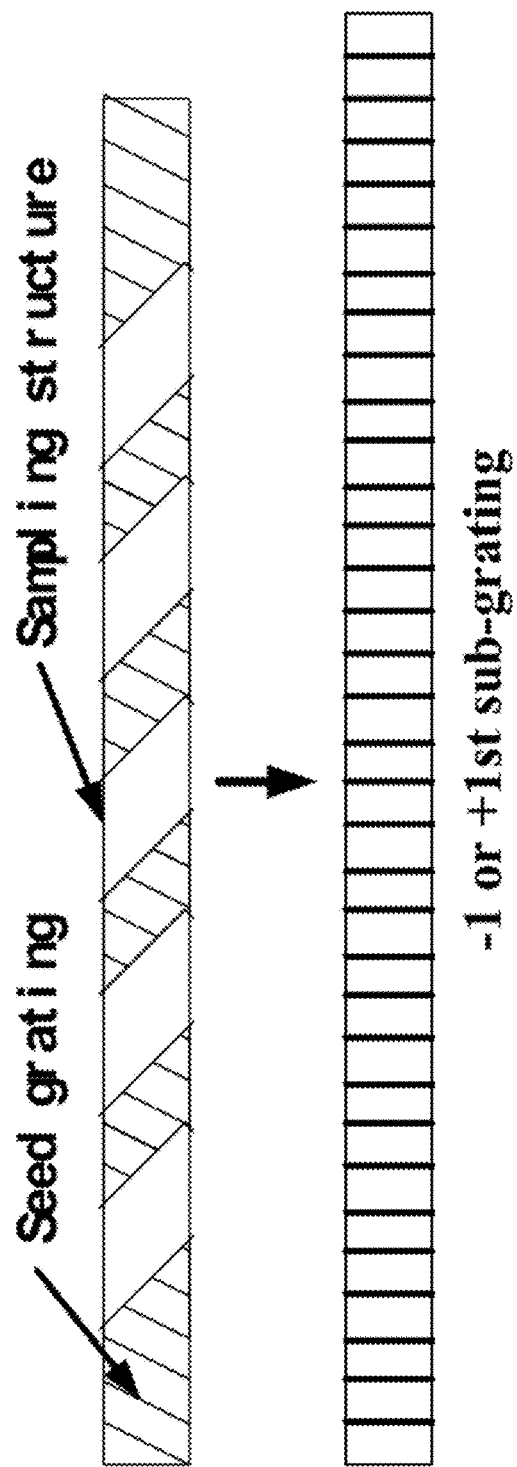
FIG. 6, the diagram of DFB sampled grating with suppressed $0^{th}$ order channel resonance.

3. DFB Semiconductor Laser Based on Reconstruction-Equivalent-Chirp (REC) Technology with the $0^{th}$ Order Channel Suppressed (FIG. 6)

The $+1^{st}$ order or the $-1^{st}$ order ghost grating is generally used as the resonant cavity in the DFB semiconductor laser design based on the Reconstruction-Equivalent-Chirp (REC) technology. Because of the largest index modulation of the $0^{th}$ order ghost grating among all of these ghost gratings, the $0^{th}$ order ghost grating is easy to form the light resonance and the single longitudinal mode operation property may deteriorate. So the $0^{th}$ order ghost must be removed outside of the gain region to suppress the potential lasing. The index modulation of the ±2st ghost grating is so weak that the potential resonance is negligible. In order to further suppress the $0^{th}$ order potential lasing, the tilted seed grating can be used together with tilted uniform sampling pattern so that the $0^{th}$ order radiation loss will be greatly increased. If designed appropriately, the wave-vector of the resulting $-1^{st}$ order or $+1^{st}$ order ghost grating will be parallel to the waveguide direction. This results in dominant light resonance of the $-1^{st}$ order or $+1^{st}$ order ghost grating with the other ghost gratings suppressed. This process is illustrated in FIG. 6. This sampled grating can improve the single mode property greatly. The equivalent phase shift or the equivalent chirp can be realized simultaneously according to Eq. (6-7) and (3-4).

Figure 7:
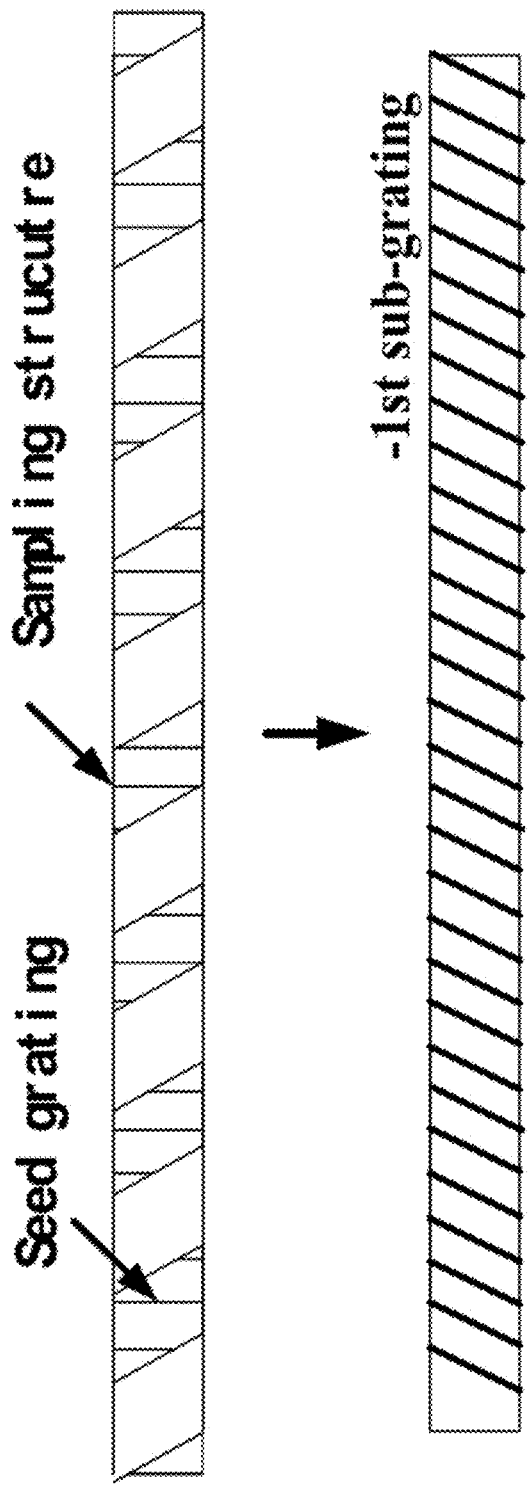
FIG. 7, the design of the tilted waveguide grating.

4. Tilted Waveguide Grating (FIG. 7)

Similar to the design of the sampled grating with tilted seed grating to suppress the $0^{th}$ order ghost grating as described above, the equivalent tilted waveguide grating can be realized by tilting sampling structure. Because there exist an included angle between the direction of the waveguide axis and that of the sampling structure, the target equivalent grating can be rotated by a certain angle. So the equivalent tilted grating can be realized. The detailed design parameters can be calculated according to Eq. (4).

The following is one design example for an equivalent tilted single mode waveguide grating. The material of the core layer is Ge:SiO$_2$ and the width of the waveguide is 6 μm. The thickness of the core is 2 μm. The effective refractive index $n_{eff}$ is 1.455. The direction of the wave-vector of the seed grating is parallel to the direction of the waveguide axis. The period of the seed grating is 500 nm. If the required tilted target grating with the grating period is equal to 532.6 nm and tilted angle is equal to 6°, i.e. the included angle between the wave-vector of the equivalent tilted grating and the waveguide axis, the designed sampling period should be 4.211 μm and the tilted angle regarding to the waveguide axis should be 55.93°.

For instance, to design the Optical Add-Drop Multiplexer (OADM) which is usually based on the tilted waveguide grating, the structure parameter is shown in [3]. FIG. 1 in Ref [3] is the diagram of Optical Add-Drop Multiplexer based on null coupler, in which the tilted waveguide grating can be equivalently realized according to Eq. (4-5).

Figure 8:
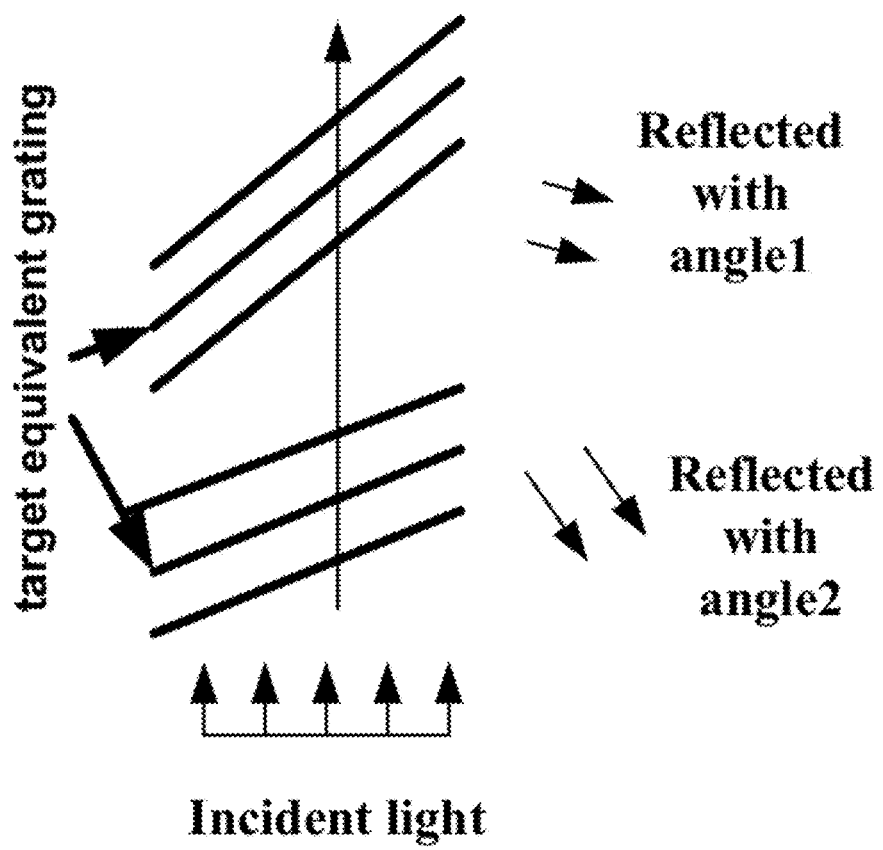
FIG. 8, the diagram of the power divider and directional coupler

5. Power Splitter and Directional Coupler (FIG. 8)

If the period and direction of the sampling structure are designed appropriately, the target equivalent grating can be rotated by a certain angle. This will diffract the light which meets the Bragg condition on the specific direction. So the required diffractive angle can be designed to make the light propagate in a specific direction and the directional coupler can be realized. If the index modulation of the seed grating is appropriately weak, part of the light which meets the Bragg condition will be reflected, and the remaining continues to prorogate in the original direction. Therefore a power splitter is realized only to properly design the index modulation. The certain magnitude of the index modulation leads to a certain diffractive efficiency. A combined device of the power splitter and the directional coupler can be realized as schematically illustrated in FIG. 8.

A design example is given below. The directional coupler with a power division ratio of 0.5 is carried out. The width of the device is 30 μm along the X axis and the length of the device is 50 μm along the Z axis. The material of the core layer is Ge:SiO2 with the effective refractive index of 1.455. The thickness of the core layer is 2 μm. The wave-vector of the seed grating is parallel to the +Z direction with the period of 485 nm. The incident light with the wavelength of 1545.5 nm and beam width of 30 μm propagate along the +Z direction. There is a diffractive beam with diffractive efficiency of about 50% propagating along the designed direction with an angle of 15.74° between the direction of reflective direction and the Z axial direction if the index modulation is about 0.001. The sampling pattern is square wave with duty cycle of 0.5. The included angle is 50° between the wave-vector of the sampling structure and that of the seed grating.

The Detailed Fabrication Process

Figures 9A, 9B:
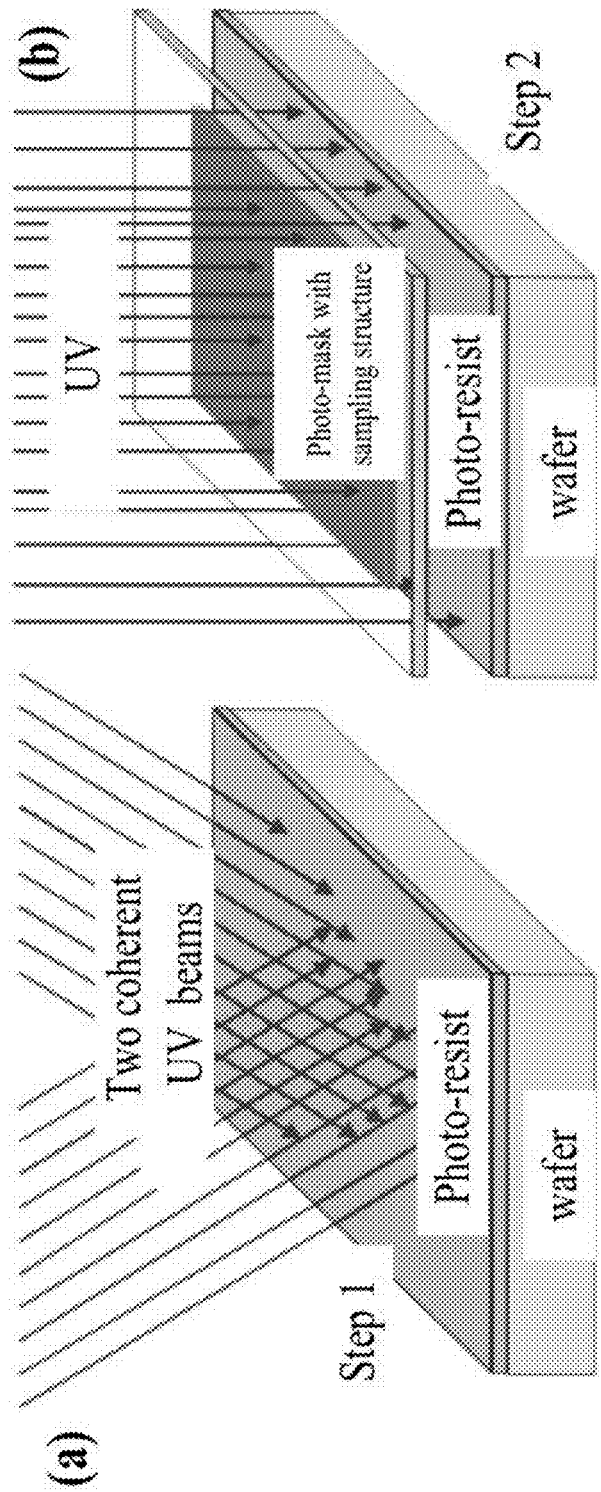
FIG. 9, (a, b) the diagram of fabricating the sampled grating, (c, d) one example of designing a equivalent tilted grating based on the Micro-structure Quasi-phase-matching technology and the composition of the wave-vectors of the sampled grating. The strong diffraction happens when the incident light satisfy the Bragg condition.
Figure 9C:
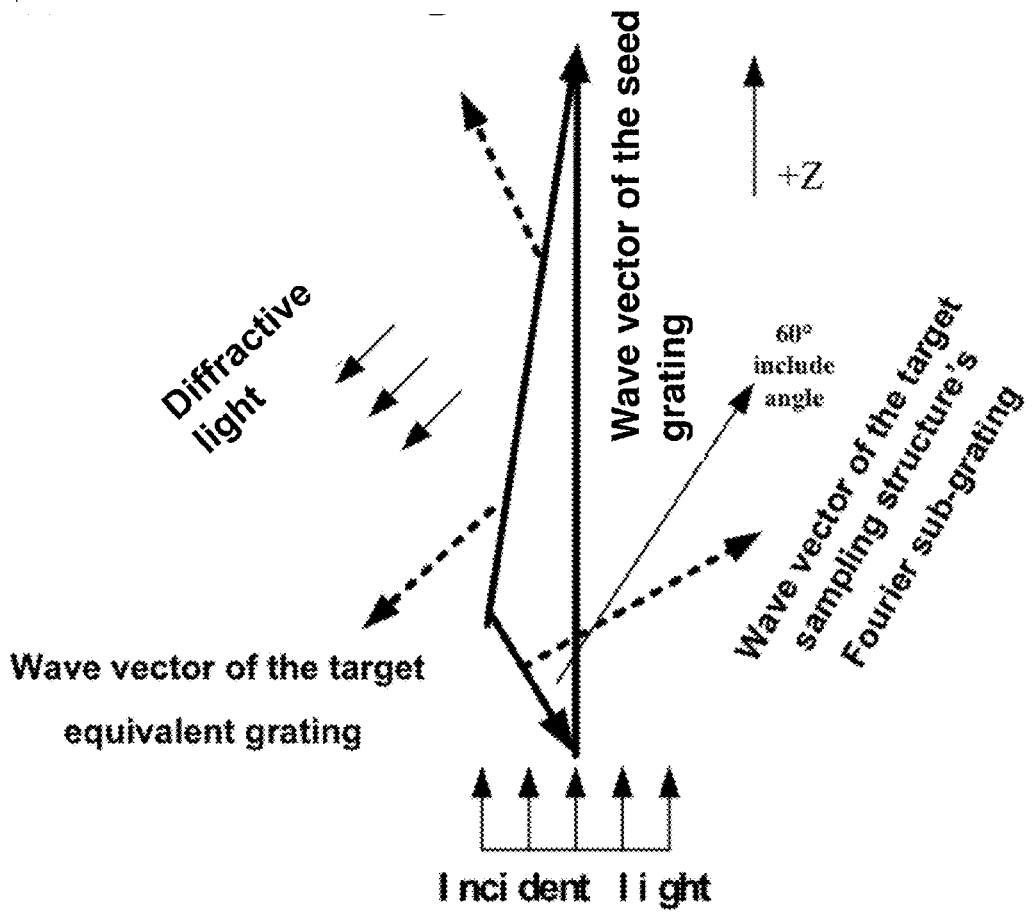
Figure 9D:
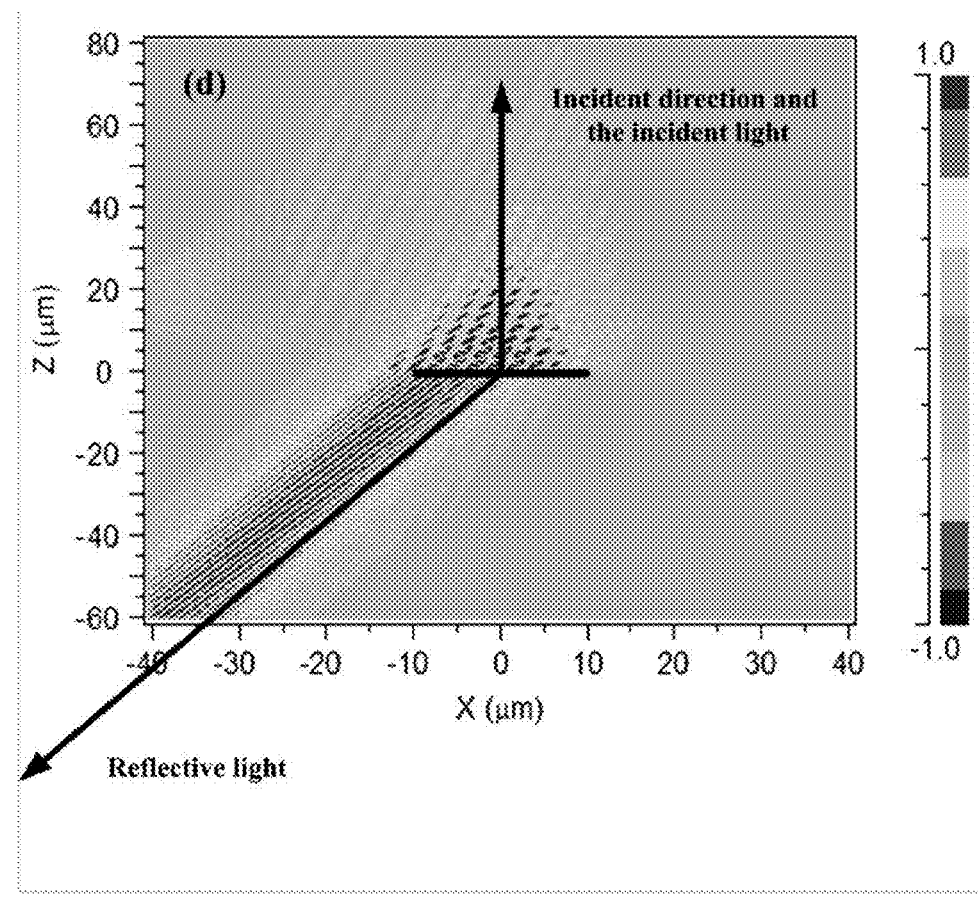

1. In this Invention, the Key of Fabricating the Two or Three Dimensional Target Equivalent Grating is to Fabricate the Sampled Grating Structure. Detailed Fabrication Processes are as Follows:
   (1) The first step is to fabricate the sampling pattern on the photo-mask. The sampling pattern is structured according to the design principle of the proposed technology. The stripes with metal in the mask correspond to sampling structure in wafer.
   (2) The fabrication process of the sampled grating structure has two steps. First, a uniform seed grating with a period of several hundreds nanometers (for example 500 nm) is fabricated through conventional holographic exposure on the photo-resist. The sampling structure is then transferred to the photo-resist by conventional photolithography using the photo-mask as described in step (1). The sampling period is several micrometers (for example 2 μm). The corresponding wave-vector of sampling structure is at an angle of 60 degree to that of the seed grating, which means that the angle between $\vec{G}_{sN}$ and $\vec{K}_0$ is 60 degree, as the schematic of wave-vectors shown in FIG. 9(*c*). Then the sampled grating pattern is transferred from the photo-resist to the wafer by dry or wet etching. The order of the two exposures can be changed. FIG. 9 (a/b) shows the fabrication of the sampled grating structure based on 2D MS-QPM technology. The effective refractive index is 1.06 and the wavelength of incident light, whose propagation direction is parallel to the wave-vector of seed grating, is 1.142 um. As a result, intensive reflection will occur when the angle between the light and the wave-vector of seeding grating is 28 degree (see FIG. 9 c/d). The device can control the propagation direction of light.

Figure 10:
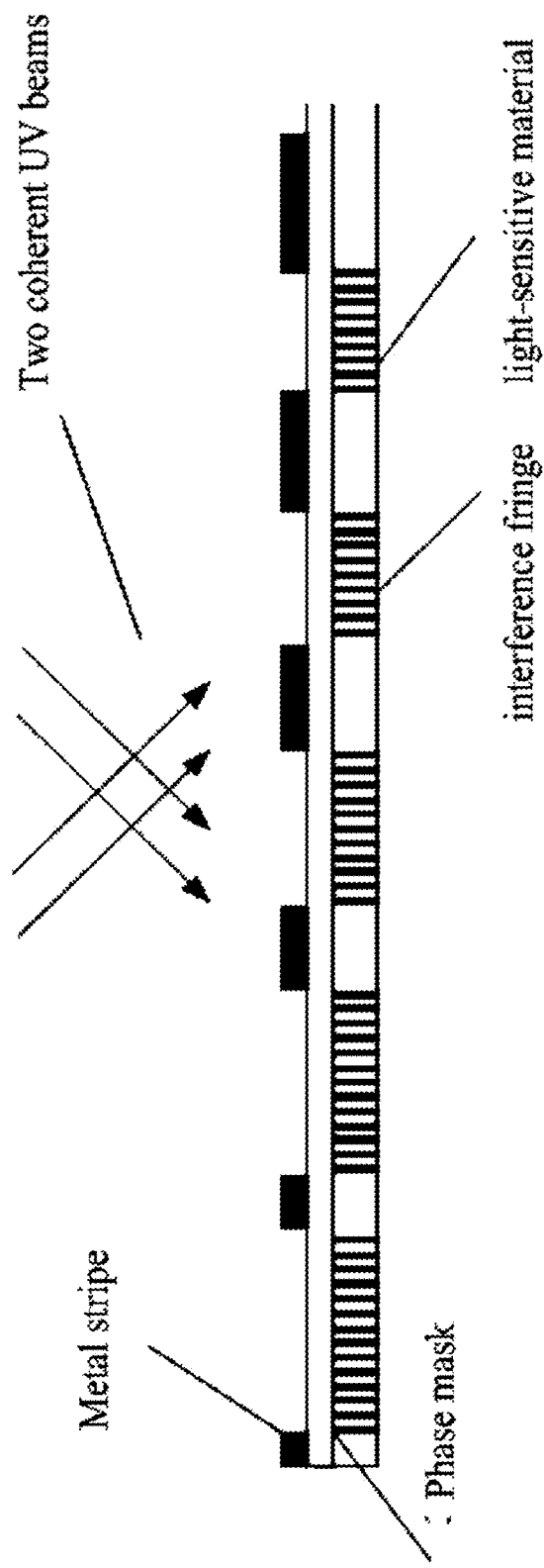
FIG. 10, the diagram of the fabrication method for sampled grating using the phase mask with metal coating.

(3) Target equivalent grating can also be fabricated by phase mask. The sampling structure pattern is first fabricated on phase mask with metal stripes and the lithography is carried out on the Ge-doped silica material or some light-sensitive materials. The phase mask should be close to the light-sensitive material when exposure happens. Then the sampled grating structure designed can be obtained after annealing. The sampling structure pattern on the phase mask has a complementary relationship with the sampling structure pattern on the photomask if the positive photo-resist is used in (2), which means that the metal stripes on mask such as Chrome on the phase mask corresponds to the region without grating. The schematic of the fabrication is shown in FIG. 10.

2. The Fabrication of the Planar Waveguide Bragg Grating Devices Based on MS-QPM Technology All of the conventional materials for fabricating planar waveguide Bragg Gratings, such as silica-on-silicon, polymer, and other III-V compound materials, can be used to realize the photonic devices based on Micro-structure Quasi-phase-matching technology. The key of fabricating such kinds of filters is to fabricate the sampled grating structure. Specific implementing method has been described in part 1 above.

Let's take the Bragg grating filter fabricated by Silicon On Insulator (SOI) ridge waveguide for example.

(1) Two photo-masks are needed before fabrication. One is used to fabricate the ridge waveguide on the SOI. This step is the same as the conventional method. The other mask with the sampling structures, such as equivalent phase shift, equivalent chirp, equivalent tilted structure, is designed.

(2) After cleaning the SOI wafer and coating with photo-resist, the SOI wafer is exposed for the first time by the photo-mask, then developed, fixed and cleaned by plasma stripper for 30 s. The ICP etching is taken after coating adhesive at 180° C. for 30 minute. The etching depth is determined by etching time. The residual photo-resist is cleaned out by plasma stripper at 150 w for 3 minutes. Thus the ridge waveguide fabrication is completed.

(3) After cleaning the wafer again and taking another exposure, the transfer of the sampled grating pattern of the second photo-mask to the photo-resist proceeds as illustrated in FIG. 9. After the process of developing, fixing, cleaning, coating adhesive, ICP etching and cleaning of residual photo-resist, the fabrication of sampled grating is finished. Finally, a 1 μm layer of $SiO_2$ is deposited on the device surface with PECVD. The two ends are polished to eliminate facet reflection.

3. The DFB Semiconductor Laser Based on REC Technology with Suppressed $0^{th}$ Channel Lasing The DFB semiconductor laser is composed of n-type substrate, n-type InP buffer, undoped lattice-matched InGaAsP lower optical confinement layer, strained-layer InGaAsP multiple-quantum-well (MQW) active structure, InGaAsP grating layer, InGaAsP waveguide layer, InP optical confinement layer and InGaAs ohm contact layer. The sampled gratings including equivalent phase shift or other structures are on the InGaAsP grating layer. The surface of the sampled grating is covered by 200-400 nm thick $SiO_2$ insulating layer.

The following is the concrete steps of fabricating the DFB semiconductor laser with work wavelength of 1550 nm based on REC and MS-QPM technology with the $0^{th}$ channel lasing suppressed.

The photo-mask with the tilted sampling structure or other special sampling structure patterns is fabricated by conventional micro-electronic fabrication processes. The sampling structure patterns are determined by the equations (3)-(7).

The device is mainly fabricated by metal organic vapor phase epitaxy (MOVPE). A 200 nm thick n-type InP buffer layer with doping concentration about $1.1 \times 10^{18}$ $cm^{-2}$, a 100 nm thick undoped lattice-matched InGaAsP lower optical confinement layer, a strained-layer InGaAsP multiple-quantum-well (MQW) active structure. The MQW structure contains five-layer undoped 6 nm-thick 1.2% compressive strain AlGaInAs wells separated by six-layer 9 nm-thick-0.45% tensile-strain AlGaInAs barriers. Then the upper separate-confinement-heterostructure (SCH) layer is grown. The sampled grating is then formed on the upper SCH layer by a conventional holographic exposure combined with conventional photolithography. After the fabrication of the sampled grating, a p-InP cladding layer and a p+-InGaAs contact layer are successively grown over the entire structure in the second epitaxial growth. Then a conventional ridge waveguide processing is performed. Ti—Au p-contacts and AuGeNi n-contacts are formed on the p-side and the n-side, respectively.

The two ends of the device are coated with antireflection coating (AR) and antireflection coating (AR) or AR and high reflective coating (HR). The typical threshold current and SMSR of the device are 14 mA and above 40 dB, respectively.

Figure 11:
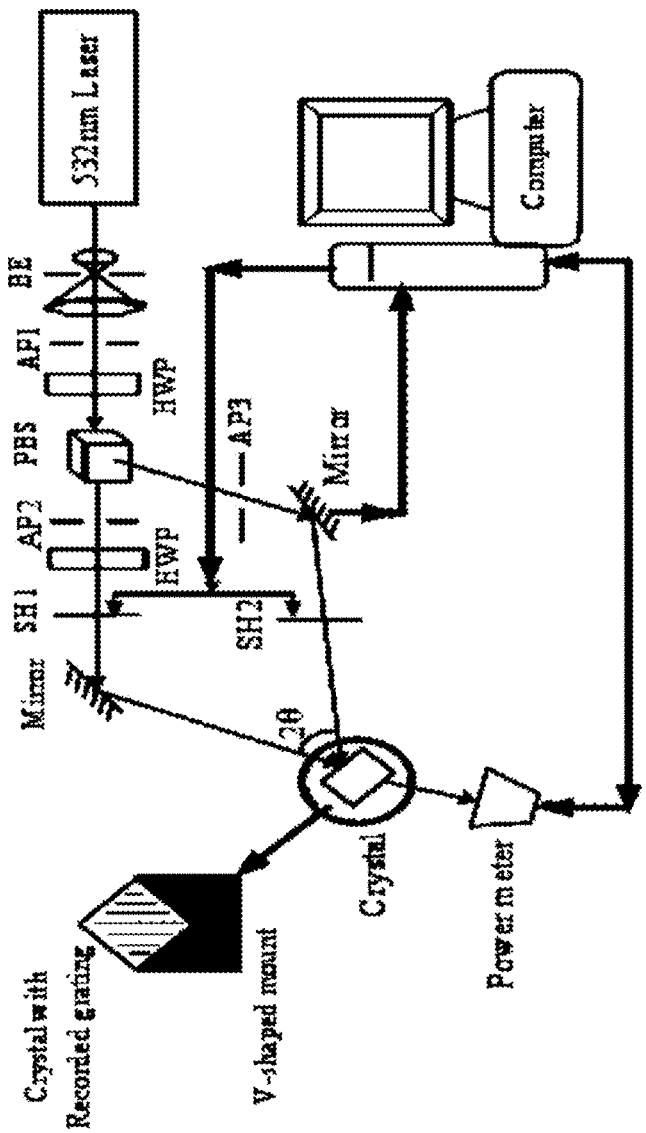
FIG. 11, the facility for fabricating the volume grating.

4. The Fabrication of the Volume Grating Based on the MS-QPM Technology (FIG. 11)

The detailed optical system of the fabrication is described as follows:

The Verdi-5 laser is used as the light source. The narrow light emitted from the laser is expanded by the beam expander system.

The expanded light is then spitted into two light beams with two orthogonal polarization stations through polarization beam splitter. The reflection light beam perpendicular to the experimental platform is used as the reference light. The transmission light with horizontal polarization is used as the object light. The intensity ratio of the two lights can be adjusted by the half-wave plate before the polarization beam splitter.

The horizontal polarization is transformed into vertical polarization when the object light passes though the half-wave plate. After passing through shutter 1 and reflected by a mirror, the object light reaches the crystal. The reference light also reaches on the crystal after it passes though shutter 2 and reflected by the other mirror.

When we write the holographic grating, shutters 1 and 2 open simultaneously. The object light and the reference light are interferential in the overlapped area where the volume grating can be formed. The whole system including shutter, power meter are all controlled by the computer.

The above procedure is the traditional method used to fabricate the volume grating. We use same procedure to fabricate the seed grating in this invention.

Because a second exposure is required to fabricate the sampling structure, the detailed procedure is described as follows:

According to Eq. (3) through (7) and the target grating, the sampling structure is determined and fabricated by the photo-mask.

The volume grating is exposed again by using the mask with sampling structure to fabricate the sampled grating. Because the index modulation strength of the grating is related to the exposure time and light intensity, a correct exposure time is selected suitably to obtain the correct index modulation.

The second method to fabricate the volume sampled grating is to use the phase mask with sampling structure, which is the same as fabrication of the waveguide mentioned above. The phase mask with sampling structure is placed before the crystal. The two light beams are interfered and projected on the mask and the crystal. The sampled grating can be fabricated all at once.

An example to realize the narrow bandwidth optical filter using equivalent it phase shift is given in the following. The included angle between the propagation direction of the incident light and the normal direction of the surface of the volume grating is 5°. The normal direction is defined as the +Z direction. The direction of the wave-vector of the seed grating is parallel to the +Z direction. The record material of the volume grating is the 0.05% Fe:LiNbO3 crystal with the size of 5 mm×5 mm×5 mm. The refractive index $n_0$ is 2.287. The seed grating period is 500 nm.

The direction of $\vec{G}_{sN}(\vec{r})$ is the same as $\vec{K}_0(\vec{r})$. Using Eq. (7), the equivalent π phase shift can be inserted in the sampled grating. The period of the target equivalent grating is 543.88 nm and the corresponding sampling period is 6.197 μm. The light with wavelength of 1550 nm can transmits through the volume grating. All of the other lights can be reflected with the reflection angle of 5°. The index modulation of the seed grating is usually 0.0015. The bandwidth of the reflection light is wider if the index modulation is stronger.

We claim:
1. A method to fabricate a multi-dimensional target waveguide grating and volume grating by microstructure quasi-phase matching technology, comprising:
   making a two or three dimensional target grating with arbitrary grating structure, comprising:
   using common waveguide Bragg grating or volume grating as the seed grating,
   wherein the seed grating is a uniform waveguide grating, having the period of the waveguide grating between 50-1000 nm;
   forming a two or three dimensional sampled grating with refractive-index-modulated sampling structure based on the seed grating, wherein the sampled grating has more than one ghost gratings or sub-gratings and one ghost grating is selected as target equivalent grating,
wherein The wave-vector of the seed grating is $\vec{K}_0(\vec{r})$, the wave-vector of the light is $\vec{k}$ and the wave-vector difference between light and the seed grating is $\vec{k}$ which can be expressed as,

$$\Delta \vec{k} = \vec{k} - \vec{K}_0(\vec{r}) \quad (1)$$

wherein the refractive index modulation of the sampled grating with arbitrary sampling structure and uniform seed grating can be expressed as, $$n_s(\vec{r}) = S[\vec{r}] \cdot n(\vec{r}) \quad (2)$$

$S[\vec{r}]$ is the sampling structure and $n(\vec{r})$ is the refractive index modulation depth of the seed grating; $\vec{r}$ denotes the space vector, based on the Fourier analysis, equation (2) can be further expressed as, $$n_s(\vec{r}) = \sum_{n=-\infty}^{n=+\infty} C_n(\vec{r}) \exp\left(j \int \vec{G}_{sn}(\vec{r}) d\vec{r}\right) n \exp\left(j \int \vec{K}_0(\vec{r}) d\vec{r}\right) = \sum_{n=\infty}^{n=+\infty} C_n(\vec{r}) n \exp\left(j \int \vec{K}_n(\vec{r}) d\vec{r}\right) \quad (3)$$

wherein j denotes an imaginary number, $\vec{G}_{sn}(\vec{r})$ is the wave-vector of the $n^{th}$ order Fourier component of the sampling structure; $\vec{K}_0(\vec{r})$ is the wave-vector of the seed grating and it can be further expressed as $$\vec{K}_0(\vec{r}) = \frac{2}{(\vec{r})} \vec{e}_0$$

$(\vec{r})$ is the period of the seed grating and
$\vec{e}_0$ denotes the direction of the seed grating, $C_n(\vec{r})$ is the Fourier coefficient, n denotes the $n^{th}$ Fourier order and describes all the Fourier components of the sampled grating, i.e. the
ghost gratings or sub-grating, according to Eq (3), there are a series of ghost gratings in the
sampled grating with their wave-vector $\vec{K}_n(\vec{r})$, all of these ghost gratings can be changed with the sampling structure $S[\vec{r}]$, and $n^{th}$ order wave-vector of the ghost grating $\vec{K}_n(\vec{r})$ corresponds to the summation of the wave-vectors of the seed grating $\vec{K}_0$ and of the $n^{th}$ order sampling structure's Fourier sub-grating $\vec{G}_{sn}(\vec{r})$, according to equation (3), the wave-vector of the target equivalent grating $\vec{K}_n(\vec{r})$ can be expressed as, $$\vec{K}_n(\vec{r}) = \vec{G}_{sN}(\vec{r}) + \vec{K}_0(\vec{r}) \quad (4)$$

when the wave-vector of the target equivalent grating $\vec{K}_N(\vec{r})$ equals to the wave-vector of the target grating $\vec{K}_d(\vec{r})$, that is, $\vec{K}_N(\vec{r}) = \vec{K}_d(\vec{r}) \cdot \vec{K}_0(\vec{r})$ is the wave-vector of the seed grating, $\vec{G}_{sN}(\vec{r})$ is the wave-vector of the target sampling structure's Fourier sub-grating, $\vec{K}_N(\vec{r})$ can be changed with the sampling structure: By changing the periodic distribution of the sampling structure $S[\vec{r}]$, the wave-vector $\vec{G}_{sN}(\vec{r})$ can be varied, then the arbitrary target grating structure can be equivalently realized, in other words, when the wave-vector of the seed grating $\vec{K}_0(\vec{r})$ mismatches the wave-vector of the required 2D or 3D target grating, one of the Fourier sub-gratings in the sampling structure i.e., the wave-vector of the target sampling structure's Fourier sub-grating $\vec{G}_{sN}(\vec{r})$ is used to compensate this mismatch, therefore, an additional target sampling structure's Fourier sub-grating is employed here to keep the phase difference equal to zero during the optical transmission process, and the following phase match is also satisfied, $$\vec{K}_d \vec{K}_0(\vec{r}) \vec{G}_{sN}(\vec{r}) = 0 \quad (5)$$

according to Eq (3), the phase of the sampled grating is also a function of space, specially the phase of the uniform ghost grating can be expressed as, $$\exp[j \vec{G}_{sn} \vec{r}] \exp(j(\vec{K}_0 \vec{r})) \quad (6)$$

when there is a phase shift in the sampling structure, and the shift value is $\vec{r}'$, a phase shift will also exist in the sampling structure's Fourier sub-grating, the corresponding phase of the ghost grating can be described as, $$\exp[j \vec{G}_{sn}(\vec{r} + \vec{r}')] \exp(j(\vec{K}_0 \vec{r})) = \exp[j \vec{G}_{sn} \vec{r}] \exp(j(\vec{K}_0 \vec{r})) \exp(j \vec{G}_{sn} \vec{r}') \quad (7)$$

wherein the corresponding phase shift of the ghost-grating has a magnitude of $\exp(j\vec{G}_{sn}\vec{r})$, for a uniform seed grating, $\vec{G}_{sn}\vec{r}'=$, so a phase shift is introduced in the $n^{th}$ order ghost grating of the sampled grating, wherein the refractive-index modulation, which corresponds to the Fourier coefficient $\vec{C}_n(\vec{r})$, can also be changed with the pattern or shape in one sampling period, such as the duty cycle, in the 2D case, the refractive-index modulation can also be equivalently changed by this method, the suitable shape in one sampling period to get the largest refractive-index modulation intensity can be obtained from the Fourier analysis.

2. The method of claim 1, further comprising realizing target equivalent grating with arbitrary grating structure, the tilted/arc grating or chirped/phase shifted grating by microstructure quasi-phase matching technology;

obtaining a specific target equivalent grating or the ghost grating with a certain Fourier order, by designing the corresponding sampling structure including sampling period distribution via composing the grating wave-vectors;

realizing the target equivalent grating with arbitrary directions or arc profiles by changing the direction of the wave-vector of the sampling structure's Fourier sub-grating $\vec{G}_{sN}(\vec{r})$, when changing the direction of the grating;

realizing the multiple-dimension phase shifted grating by phase shifting in the sampling structure according to Eq (5)-(7);

realizing the chirped grating, by changing the sampling period and direction of the sampling structure in space; and using holographic exposure by interference, or near field holographic exposure to fabricate the uniform seed grating and using photolithography technique to fabricate the sampling structure.

3. The method of claim 1, further comprising fabricating wavelength division multiplexer/demultiplexer based on the waveguide grating or the volume grating, comprising implementing a cascade sampling structure, consisting of several sections in the two dimensional waveguide grating, wherein each section is of a particular sampling structure including a particular sampling period and direction of the corresponding wave-vector, to make the target equivalent grating in each section of the sampled grating diffract a light beam with certain frequency (Bragg wavelength), as the seed grating keeps uniform; or adopting chirped seed gating as the sampled grating, wherein the seed grating is chirped and the sampling structure is kept uniform and achieving the demultiplexer as the light with different frequencies (wavelengths) is reflected in different directions in different target equivalent gratings in different sections of the sampled grating achieving the multiplexer when lights with different frequencies propagating in given directions and positions, are reflected in the same direction and coupled into one single waveguide, following the Bragg diffraction conditions;

determining the total cavity length of the multiplexer/demultiplexer devices by the number of the channels; and fabricating the sampling period of the multiplexer/demultiplexer grating at 0.5 to 20 µm for a two-dimensional waveguide.

4. The method of claim 1, further comprising fabricating Bragg grating filter based on multi-dimensional target waveguide grating, comprising:

inserting two equivalent π phase shifts in the 1/4 and 3/4 positions of the target equivalent grating, to form a narrow pass-band in the middle of the stopband;

realizing the equivalent π phase shifts by Eq (5) to (7); and covering one whole optical communication window when the cavity lengths are about 50.0 µm to 5000.0 µm, the corresponding refractive index modulation intensity is 0.2 or larger and stopband of the transmission light is up to 40 nm or even wider.

5. The method of claim 1, further comprising fabricating a DFB semiconductor laser based on Reconstruction-equivalent-chirp (REC) technology with the suppressed $0_{th}$ order resonance, comprising:

keeping the period of the seed grating uniform but tilted with an included angle (2° to 15°) between the direction of the wave-vector $\vec{K}_0(\vec{r})$ and the axial direction of the waveguide, using the waveguide as resonant cavity;

tilting the designed sampling structure with some tilted angle, according to Eq (4), and rotating the direction of the target equivalent grating's wave-vector $\vec{K}_N(\vec{r})$ to be parallel to the axial direction of the resonant cavity, wherein the Fourier order N is equal to ±1, the specific tilted angle of the seed grating wave-vector $\vec{K}_0(\vec{r})$ is determined according to the effect on the suppression of $0_{th}$ order channel's resonance, and the tilted angle is from 2° to 15°, which enables a good suppression, wherein detailed designing parameters of the seed grating and the sampling structure is determined according to Eq.(4) and the period of the sampling structure varies from 0.5 to 20 µm, and when the tilted angle is larger than 10°, the light resonance of the $0_{th}$ order channel is fully suppressed.

6. The method of claim 1, wherein the tilted waveguide grating is fabricated with the following characteristic: the uniform seed grating is used and the direction of the wave-vector $\vec{K}_0(\vec{r})$ is designed according to the actual requirement; the sampling period is also uniform but there is a tilted angle between the wave-vector of the target sampling structure's Fourier sub-grating $\vec{G}_{sN}(\vec{r})$ and the seed grating; a tilted angle between the wave-vector of the target equivalent grating $\vec{K}_N(\vec{r})$ and the axial direction of the waveguide according to Eq (4), this tilted angle is designed to be from 2° to 15°.

7. The method of claim 1, further comprising fabricating a power divider with arbitrary power division ratio and fabricating a directional coupler with arbitrary coupling direction, based on microstructure quasi-phase matching technology, comprising setting up different sampling structures in different sections of the waveguide for the power divider or the directional coupler;

reflecting incident light with a specific wavelength along different directions for the corresponding target equivalent gratings with different directions in different sections of the waveguide;

designing the reflective directions on purpose and calculating the detailed parameters according to Eq (4) to realize the directional coupler;

reflecting a portion of the incident light power by the sampled grating while properly designing the refractive-index modulation, in order to obtain the power divider, wherein the refractive-index modulation intensity is between 0.001 to 0.2 and the larger refractive-index modulation intensity of the target equivalent grating gives a higher diffractive efficiency.

8. The method of claim 1, further comprising fabricating an arbitrary volume grating filter and volume grating based photonic device based on the microstructure quasi-phase matching technology, comprising
keeping the seed grating uniform;
realizing sampling structure by photomask;
using the common photolithography method;
designing the sampling structure according to the equations from Eq (3) to Eq (7); and
realizing the target grating structure by the target equivalent grating.

9. The method of claim 1, further comprising fabricating a waveguide grating based photonic device with fine grating structure based on the MS-QPM technology, comprising
fabricating a uniform seed grating by holographic exposure;
obtaining required target equivalent grating by designing the sampling structure
according to the equations from Eq (3) to Eq (7),
realizing the sampled grating by the common photolithography method; and
achieving various waveguide grating based photonic devices.

10. The method of claim 1, further comprising fabricating a photonic integrated circuits with DFB semiconductor laser array based on REC technology, waveguide grating filters, coupler and multiplexer/demultiplexer to be monolithically integrated on the same chip,
wherein all the photonic integrated circuits, waveguide grating filters and coupler and multiplexer/demultiplexer share the same seed grating, while the sampling structure are designed separately according to the equations Eq (3) to Eq (7), and the whole sampling structure is fabricated on the same mask to realize the whole sampled grating on the same chip at the same time to achieve the monolithic integration of different photonic elements.

11. The method of claim 3, further comprising fabricating a 8-channel WDM Multiplexer/Demultiplexer based on the multiple sections (layers) sampled grating structure,
wherein the core of the two-dimensional planar waveguide is made of Ge:SiO2 with the effective refractive index equal to 1.455,
the refractive index modulation of the seed grating is 0.006, the width of the device is 40 μm along X direction, the length of each section is 100 μm and the total length of the device is 1200 μm along Z axis;
wherein the direction of the wave-vector $\vec{K}_0(\vec{r})$ of the seed grating is parallel to the +Z direction with the grating period of 500 nm; the channel spacing is 2 nm and the operating wavelength is from 1544 nm to 1558 nm; the incident polychromatic light is also parallel to the +Z direction; the +1$^{st}$ ghost grating works as the target equivalent grating; the wave-vector of the seed grating and the incident light are all parallel to the +Z direction, all of these included angles can be either clockwise or counterclockwise, and the sampling structures of these two cases appear to be of mirror symmetry regarding to +Z direction, fabricating a directional coupler with power division ratio of 0.5, wherein the width of the device is 30 μm along the X axis and the length of the device is 50 μm along the Z axis; the material of the core layer is Ge:SiO2 with the effective refractive index of 1.455; the thickness of the core layer is 2 μm;

wherein the wave-vector of the seed grating $\vec{K}_0(\vec{r})$ is parallel to the +Z direction with the period of 485 nm; the incident light with the wavelength of 1545.5 nm and the beam width of 30 μm propagate along the +Z direction; there is a diffractive beam with the diffractive efficiency of about 50% propagating along the designed direction with an angle of 15.74° between the direction of reflective direction and the -Z axial direction, while the rest 50% propagates along +Z direction, the corresponding refractive index modulation intensity is about 0.001;

the sampling pattern is square wave with the duty cycle of 0.5; and the included angle is 50° between the wave-vector of the sampling structure and that of the seed grating.

12. The method of claim 6, further comprising fabricating the DFB semiconductor laser based on the Reconstruction-Equivalent-Chirp technology with suppressed 0$^{th}$ channel, wherein
the effective refractive index is 3.1; the cavity length is 400 μm; the width of the ridge waveguide is 2 μm; the period of the seed grating is 238 nm; the sampling period is 3 μm; the angle between the wave-vector $\vec{G}_{sN}(\vec{r})$ and the axial direction of the waveguide is 53.67°, the angle between the seed grating wave-vector $\vec{K}_0(\vec{r})$ and the axial direction of the laser waveguide is 3.67°, both of the angle of $\vec{G}_{sN}(\vec{r})$ and $\vec{K}_0(\vec{r})$ with the axial direction of waveguide are clockwise or anticlockwise; the direction of the wave-vector of -1$^{st}$ order target equivalent grating is parallel to the waveguide axial direction and its grating period is 250.27 nm, and the corresponding Bragg wavelength is 1551.71 nm.

13. The method of claim 2, further comprising fabricating photonic integrated circuits with DFB semiconductor laser arrays based on REC technology, waveguide grating filters, coupler and multiplexer/demultiplexer to be monolithically integrated on the same chip,
wherein all the photonic integrated circuits, waveguide grating filters, and coupler and multiplexer/demultiplexer share the same seed grating, while the sampling structures are designed separately according to the equations Eq (3) to Eq (7),
and the whole sampling structure is fabricated on the same mask to realize the whole sampled grating on the same chip at the same time to achieve the monolithic integration of different photonic elements.

* * * * *